United States Patent
Schneider et al.

(10) Patent No.: US 9,134,613 B2
(45) Date of Patent: Sep. 15, 2015

(54) ILLUMINATION AND DISPLACEMENT DEVICE FOR A PROJECTION EXPOSURE APPARATUS

(71) Applicant: Carl Zeiss SMT GmbH, Oberkochen (DE)

(72) Inventors: Sonja Schneider, Oberkochen (DE); Norbert Wabra, Werneck (DE); Martin von Hodenberg, Oberkochen (DE); Boris Bittner, Roth (DE); Ricarda Schneider, Zusmarshausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/272,982

(22) Filed: May 8, 2014

(65) Prior Publication Data

US 2014/0239192 A1     Aug. 28, 2014

Related U.S. Application Data

(63) Continuation of application No. PCT/EP2012/071846, filed on Nov. 5, 2012.

(60) Provisional application No. 61/563,111, filed on Nov. 23, 2011.

(30) Foreign Application Priority Data

Nov. 23, 2011   (DE) .......................... 10 2011 086 949

(51) Int. Cl.
*G03B 27/42* (2006.01)
*G03F 7/20* (2006.01)

(52) U.S. Cl.
CPC .......... *G03F 7/2002* (2013.01); *G03F 7/70191* (2013.01); *G03F 7/70558* (2013.01)

(58) Field of Classification Search
USPC ......................................... 250/492.1; 355/53
See application file for complete search history.

(56) References Cited

U.S. PATENT DOCUMENTS

| 6,650,399 B2 | 11/2003 | Baselmans et al. |
| 6,859,515 B2 | 2/2005 | Schultz et al. |

(Continued)

FOREIGN PATENT DOCUMENTS

| DE | 10 2006 042 452 A1 | 8/2007 |
| EP | 0 952 491 A2 | 10/1999 |

(Continued)

OTHER PUBLICATIONS

International Search Report for corresponding PCT Appl No. PCT/EP2012/071846, dated Mar. 1, 2013.

(Continued)

*Primary Examiner* — Phillip A Johnston
*Assistant Examiner* — Hsien Tsai
(74) *Attorney, Agent, or Firm* — Fish & Richardson P.C.

(57) ABSTRACT

An illumination and displacement device for a projection exposure apparatus comprises an illumination optical unit for illuminating an illumination field. An object holder serves for mounting an object in such a way that at least one part of the object can be arranged in the illumination field. An object holder drive serves for displacing the object during illumination in an object displacement direction. A correction device serves for the spatially resolved influencing of an intensity of the illumination at least of sections of the illumination field, wherein there is a spatial resolution of the influencing of the intensity of the illumination of the illumination field at least along the object displacement direction. This results in an illumination and displacement device in which field-dependent imaging aberrations which are present during the projection exposure do not undesirably affect a projection result.

25 Claims, 12 Drawing Sheets

(56) References Cited

U.S. PATENT DOCUMENTS

| | | | |
|---|---|---|---|
| 7,333,216 B2 | 2/2008 | Wegmann et al. | |
| 8,705,005 B2 | 4/2014 | Deguenther et al. | |
| 2003/0025890 A1* | 2/2003 | Nishinaga | 355/53 |
| 2004/0135847 A1* | 7/2004 | Miura | 347/48 |
| 2004/0160583 A1* | 8/2004 | Hubertus Mulkens et al. | 355/30 |
| 2006/0262288 A1 | 11/2006 | Armstrong | |
| 2008/0013680 A1 | 1/2008 | Singer et al. | |
| 2009/0040495 A1 | 2/2009 | Schwab | |
| 2009/0086190 A1* | 4/2009 | Kodama et al. | 356/28 |
| 2009/0251677 A1* | 10/2009 | Endres et al. | 355/71 |
| 2010/0157269 A1 | 6/2010 | Deguenther et al. | |
| 2012/0090394 A1* | 4/2012 | Abdalla et al. | 73/596 |

FOREIGN PATENT DOCUMENTS

| | | |
|---|---|---|
| EP | 1 225 481 A2 | 7/2002 |
| WO | WO 2007/093433 | 8/2007 |
| WO | WO 2009/024164 | 2/2009 |
| WO | WO 2009/087805 | 7/2009 |
| WO | WO 2009/135586 | 11/2009 |
| WO | WO 2010/034674 | 4/2010 |

OTHER PUBLICATIONS

The Germany Office Action, with certified translation thereof, for corresponding DE Appl No. 10 2011 086 949.2, dated Jul. 3, 2012.

* cited by examiner

ILLUMINATION AND DISPLACEMENT DEVICE FOR A PROJECTION EXPOSURE APPARATUS

CROSS-REFERENCE TO RELATED APPLICATIONS

The present application is a continuation of, and claims benefit under 35 USC 120 to, international application PCT/EP2012/071846, filed Nov. 5, 2012, which claims benefit under 35 USC 119 of German Application No. 10 2011 086 949.2, filed Nov. 23, 2011. International application PCT/EP2012/071846 also claims priority under 35 USC 119(e) to U.S. Provisional Application No. 61/563,111, filed Nov. 23, 2011. The contents of International application PCT/EP2012/054664, U.S. Provisional Application No. 61/563,111 and German Patent Application DE 10 2011 086 949.2 are incorporated by reference.

The invention relates to an illumination and displacement device for a projection exposure apparatus. Furthermore, the invention relates to an optical system comprising such an illumination and displacement device, a projection exposure apparatus comprising such an optical system, a method for producing structured components via such a projection exposure apparatus, and a micro- or nanostructured component, produced according to such a method.

An illumination and displacement device for a projection exposure apparatus is known from WO 2009/135586 A1. Correction devices for the spatially resolved influencing of an intensity of the illumination of an illumination field are known from US 2009/0040495 A1 and US 2006/0262288 A1.

It is an object of the present invention to develop such an illumination and displacement device in such a way that field-dependent imaging aberrations which are present during the projection exposure do not undesirably affect a projection result.

This object is achieved according to the invention via an illumination and displacement device comprising an illumination optical unit for illuminating an illumination field, an object holder for mounting an object in such a way that at least one part of the object can be arranged in the illumination field, an object holder drive for displacing the object during illumination in an object displacement direction, and a correction device for the spatially resolved influencing of an intensity of the illumination at least of sections of the illumination field. There is a spatial resolution of the influencing of the intensity of the illumination of the illumination field at least along the object displacement direction. The effect of the correction device on the intensity of the illumination of the illumination field is such that inner sections of the illumination field can be influenced without the simultaneous influencing of outer sections of the illumination field surrounding the inner sections.

According to the invention, it has been recognized that the undesirable effects of field-dependent imaging aberrations on a projection result can be reduced via spatially resolved influencing of an intensity of the illumination over the illumination field, if the intensity of the illumination is correspondingly influenced in a spatially resolved manner. In this case, the correction device can influence the illumination intensity in a spatially resolved manner such that field regions with weaker imaging, that is to say with poorer image aberration correction, contribute to the total imaging power with smaller intensity proportions. Where the field is imaging-corrected well, by contrast, a higher illumination intensity is predefined via the correction device. The projection exposure apparatus can be operated with EUV light in the range of between 5 nm and 30 nm, in particular at wavelengths of 13.5 nm or approximately 6.9 nm. In this case, since the illumination system of an EUV projection exposure apparatus is operated in a vacuum anyway, a dedicated evacuation of the correction device can be dispensed with. As an alternative to EUV illumination, the projection exposure apparatus for which the correction device is used can also be operated with DUV light, in particular in the range of 248 nm, or with VUV light, in particular in the range of 193 nm. In this case, the correction device can be operated in a dedicated vacuum chamber, for example, which can be accommodated within the illumination system of the projection exposure apparatus. The correction device can comprise at least one optical component arranged in a projection optical unit of an optical system of the projection exposure apparatus. The effect of the correction device on the illumination intensity of the illumination field, according to which inner sections of the illumination field can be influenced without the influencing of outer sections of the illumination field surrounding the inner sections, relates in each case to one and the same instant. The effect of the correction device on the intensity of the illumination of the illumination field can be such that inner sections of the illumination field are influenced without the simultaneous influencing of outer sections of the illumination field surrounding the inner sections.

In the case of a redistribution by a correction device designed such that it brings about a redistribution of the illumination intensity along the object displacement direction at least in sections of the illumination field, the illumination intensity is distributed such that field regions with good image aberration correction are illuminated more intensively than others. The correction device can be arranged in a field plane and/or in a pupil plane of the illumination optical unit of the illumination and displacement device. As an alternative or in addition to a redistribution of the illumination intensity, the illumination intensity can be influenced by attenuation of the illumination light.

The correction device can comprise an optical component arranged in proximity to the field, and the contributions of the optical component with regard to imaging aberrations to be corrected vary along the object displacement direction. Such an optical component arranged in proximity to the field has a direct effect on the image aberrations in a spatially resolved manner. An optical component is in proximity to the field, that is to say arranged optically in or adjacent to a field plane, when the parameter P of the optical component in accordance with WO 2009/024164 A is at most 0.5, and in particular at most 0.1. The optical component arranged in proximity to the field can be part of a projection optical unit of an optical system of the projection exposure apparatus. The optical component arranged in proximity to the field can be an optical component which is transmissive to illumination light, that is to say which is operated refractively, in particular.

A correction device can comprise: an ejection device comprising at least one ejection channel for attenuating bodies that are attenuating for the illumination light; a collecting device for the ejected attenuating bodies, wherein the ejection device and the collecting device are designed and arranged for the passage of the illumination light beam through at least one trajectory of the attenuating bodies between the ejection device and the collecting device; and a control device, which is signal connected to the ejection device for predefining ejection instants for ejecting in each case at least one attenuating body from the at least one ejection channel. Via such a correction device, ejection instants for ejecting attenuating bodies are predefined, makes possible an intensity influencing of the illumination light which is suitable for EUV (extreme ultraviolet), in particular. The attenuating bodies are present as discrete bodies in terms of their trajectory. The attenuating bodies fly freely between the ejection device and the collecting device, that is to say without mechanical guidance. The attenuating bodies can attenuate the illumination light by absorption and/or scattering. The correction device can be operated in a vacuum or high vacuum, which allows good trajectory control of the attenuating bodies owing to lack of air resistance. Technological experience from the construction of ink jet printers can be used in the construction of the ejection device. The correction device is used for influencing an intensity distribution of the illumination light beam over the object field of the projection exposure apparatus. The attenuating bodies may be liquid or solid particles.

The ejection device can comprise at least one row of ejection channels. Such a row or array-wise arrangement of ejection channels allows a high spatial resolution of the intensity influencing over the cross section of the illumination light beam. In so far as an array of ejection channels is used in the correction device, the positions of the ejection channels in the different rows can be arranged in a manner offset relative to one another, which again increases the resolution in the dimension along the rows. The ejection channels can all run within an ejection channel plane. The trajectories of the attenuating bodies which are respectively assigned to the ejection channels can run parallel to one another, but also at an angle with respect to one another. A course of the trajectories at an angle with respect to one another makes it possible to predefine a higher trajectory density at locations at which it should be expected that a greater attenuation of the beam intensity has to be achieved.

The collecting device and the ejection device can be in fluid connection with each other. In such a system, independent drivability allows a one-dimensional or else a two dimensional illumination light beam cross section correction, such that a corresponding field distribution or else illumination angle distribution correction of the illumination of an illumination field or object field can occur. Droplets can be used as attenuating bodies. Droplets have proved to be suitable attenuating bodies. The droplets can be microdroplets. They can be mercury droplets. Alternatively, instead of droplets it is also possible for solids to be ejected, for example microparticles. The attenuating bodies can be ejected by the ejection device with a carrier gas or without a carrier gas. As carrier gas it is possible to use a gas which has a low absorption at a used wavelength of the illumination light. For EUV wavelengths, helium (He) can be used as a carrier gas. Alternatively, an He/N mixture or pure nitrogen (N) can also be used as a carrier gas, in particular at used wavelengths higher than EUV wavelengths. The collecting device and the ejection device of the correction device can be fluid connected to one another. Such a fluid connection makes possible a closed circuit for the attenuating body material within the correction device. In order to detect a wavefront of the illumination light beam, a measuring device, which can be part of the correction device, can be signal connected to a control device. Such a measuring device enables the correction device to be operated with closed loop control. Predefined desired values of a field intensity distribution over an object field of the projection exposure apparatus can be predefined with closed loop control by comparison with detected actual values of the field intensity distribution and corresponding driving of the correction device. Alternatively, closed loop control can also be effected on the basis of a comparison between actual wavefront values detected by the measuring device and predefined desired wavefront values.

A correction device can comprise an evacuated chamber through which runs at least one trajectory of the attenuating bodies between the ejection device and the collecting device, wherein the evacuated chamber comprises an entrance window transmissive to the beam of illumination light and an exit window transmissive to the beam of illumination light. Such a correction device ensures that the attenuating bodies, in particular where they pass through the beam of illumination light, are not undesirably disturbed by particle impacts of a surrounding atmosphere. The ejection device and/or the collecting device can be contained in the evacuated chamber. This ensures that the complete trajectory of the attenuating bodies between the ejection device and the collecting device is not undesirably disturbed by particle impacts of the surrounding atmosphere. The configuration of the correction device with the evacuated chamber is particularly advantageous where a beam path of the illumination light beam otherwise does not run in an evacuated space. Alternatively, it is possible, in the evacuated chamber relative to pressure ratios present outside the evacuated chamber, to set pressure ratios coordinated again with the requirements of the attenuating body flight in a targeted manner.

The correction device can comprise a plurality of optical sections connected to an optical unit carrier, the effect of which optical sections on partial beams of the illumination light for illuminating sections of the illumination field along the object displacement direction can be influenced in a targeted manner by driving the respective optical section. Such optical sections of the correction device can be embodied as an LCD array. The illumination light partial beams can then be influenced in a targeted manner via controlled predefinition of an absorption of the array elements. This can be done using a polarization of the illumination light.

The plurality of the optical sections of the correction device can be realized by the mirrors of a mirror array. Such a mirror array allows a redistribution of the illumination intensity without undesirable loss of light. Alternatively, the optical sections can be made available by elements made available in a changer, which elements can be introduced into the illumination light path in a controlled manner.

The effect of the correction device on the intensity for illuminating the illumination field at three equidistant object field points can be as follows. In a first influencing situation brought about the correction device, the intensity at the first of the three object field points along the object displacement direction deviates from an uninfluenced intensity at the first object field point by a first influencing intensity factor, and the intensity at the second of the three object field points along the object displacement direction deviates from an uninfluenced intensity at the second object field point by a second influencing intensity factor. In a second influencing situation brought about by the correction device, the intensity at the second of the three object field points along the object displacement direction deviates from an uninfluenced intensity at the second object field point by the first influencing intensity factor, and the intensity at the third of the three object field points along the object displacement direction deviates from an uninfluenced intensity at the third object field point by a third influencing intensity factor. The third influencing intensity factor (k3) differs from the second influencing intensity factor. Such a correction device of the illumination and displacement device makes it possible to set intensity profiles along the object displacement direction which are not possible with diaphragms or neutral filters that are inserted into an illumination beam path from outside in or in proximity to a field plane. In comparison for example with uniformity influencing devices which are known as UNICOM and are described in EP 0 952 491 A2, for example, this results in new degrees of freedom when predefining intensity profiles over the illumination field. These new degrees of freedom can be used for optimizing the imaging performance and/or the throughput of the projection exposure apparatus.

An optical system can comprise an illumination and displacement device as described above, a projection optical unit for imaging an object field into an image field which coincides with the illumination field or is contained therein, a substrate holder for mounting a substrate in such a way that at least one part of the substrate can be arranged in the image field, a substrate holder drive for displacing the substrate during illumination parallel to the object displacement direction, and a synchronizing unit for synchronizing the object holder driver with the substrate holder drive. The advantages of such an optical system correspond to those which have already been mentioned above with reference to the illumination and displacement device. The displacement of substrate holder with respect to object holder can be effected in the same sense or in opposite senses along the object displacement direction.

In an optical system, the projection optical unit can have a spatial distribution of imaging aberrations that varies over the illumination field, wherein the correction device is embodied in such a way that it influences the intensity of the illumination at least of sections of the illumination field depending on the spatial distribution, of the imaging aberrations of the projection optical unit. Such optical system affords the possibility of the correction of imaging aberrations that vary over the illumination field with the aid of the correction device.

An optical unit can include a measuring device for the measurement of a wavefront of imaging light over the image field, wherein the measurement is spatially resolved at least along the object displacement direction, and the measuring device is signal connected to an open loop/closed loop control device, which is in turn signal connected to the correction device. Such a measuring device allows the illumination intensity to be influenced with feedback depending on the result of the wavefront measurement. Alternatively or additionally, the waterfront can be calculated via a simulation. The actual wavefront values detected and/or calculated via the measuring device are compared with desired wavefront values. In preparation, the effect of driving of the correction device on the wavefront is detected. Depending on the result of the desired/actual comparison of the wavefront, the correction device can then be driven for closed-loop control.

A projection exposure apparatus can include an optical system as described above and a light source for the illumination and imaging light. The advantages of such a projection exposure apparatus correspond to those which have already been explained above with reference to the optical system.

The light source can operate in a pulsed fashion, wherein the correction device serves for predefining different illumination intensity distributions—which are spatially resolved along the object displacement direction—over the illumination field between individual light pulses of the light source which are used for illumination. A changeover of the correction device in the case of a light source operating in such a pulsed fashion makes possible a shot to shot predefinition of a desired image aberration minimization.

A method for producing structured components can comprise the following steps: providing a wafer on which a layer composed of a light sensitive material is at least partly applied; providing a reticle as object which comprises structures to be imaged; providing a projection exposure apparatus as described above and comprising an optical system set via the correction device; projecting at least one part of the reticle onto a region of the layer of the wafer with the aid of the projection exposure apparatus, wherein the reticle and the wafer are displaced in a synchronized manner via an optical system as described above during projection. A first field point, which is imaged with a smaller imaging aberration, than a second field point, can be illuminated with a higher intensity than the second field point. Field points whose illumination intensity is influenced by the correction device can lie on a straight line running parallel to the object displacement direction. The advantages of such production method and of a micro- or nanostructured component made by such production methods correspond to those which have already been explained above with regard to the projection exposure apparatus. Overall, it is possible to achieve a well defined illumination of the object during the operation of the projection exposure apparatus and thus a correspondingly high projection resolution, which results in the possibility of components produced in a finely structured manner, for example of electronic semiconductor components, e.g. of memory chips.

Exemplary embodiments of the invention are explained in greater detail below with reference to the drawing in which.

Figure 9:
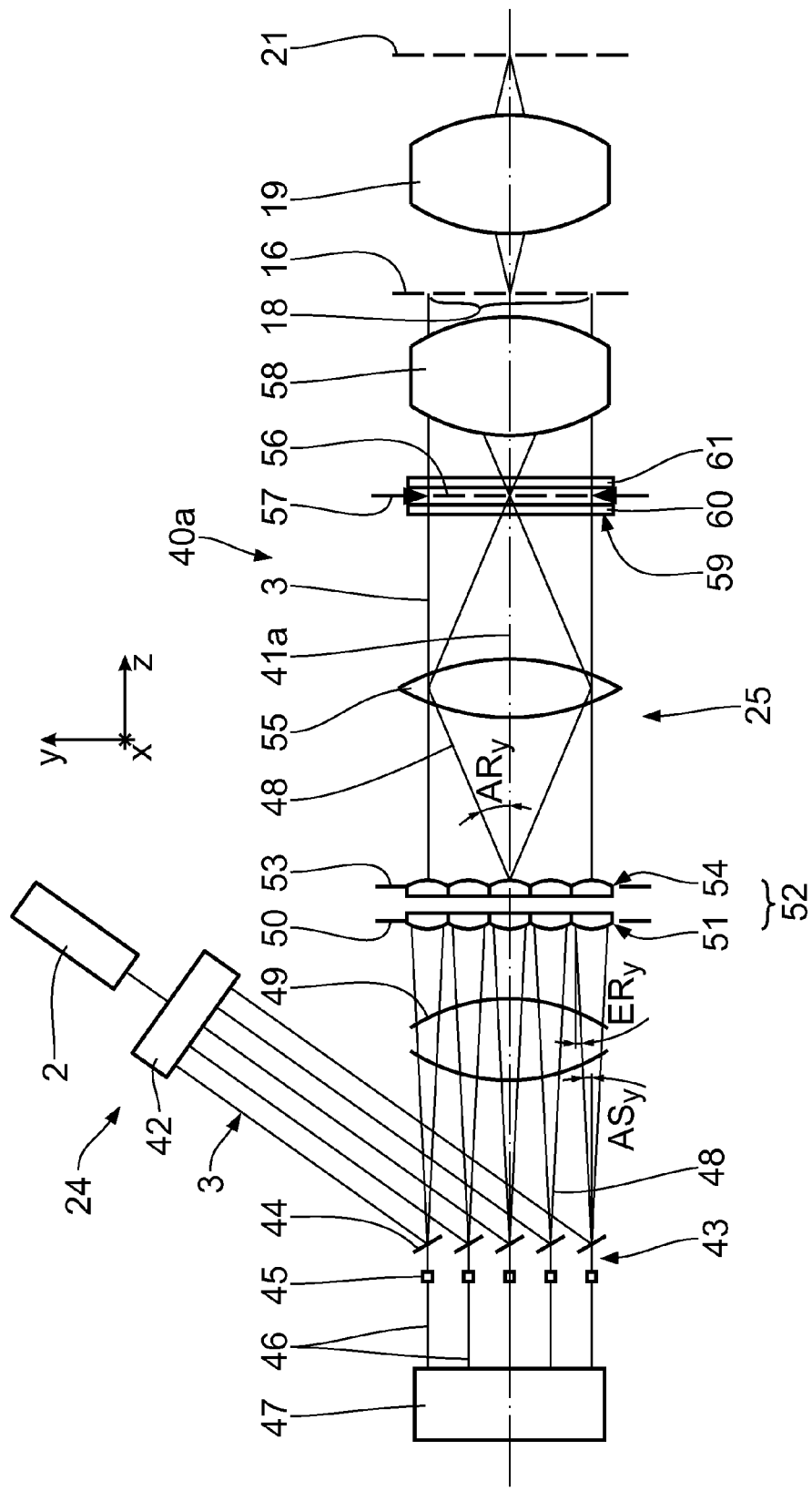
Figure 10:
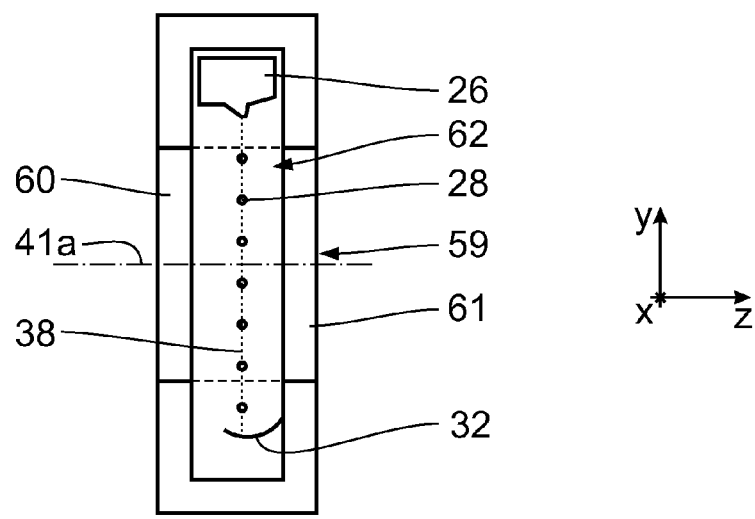
Figure 11:
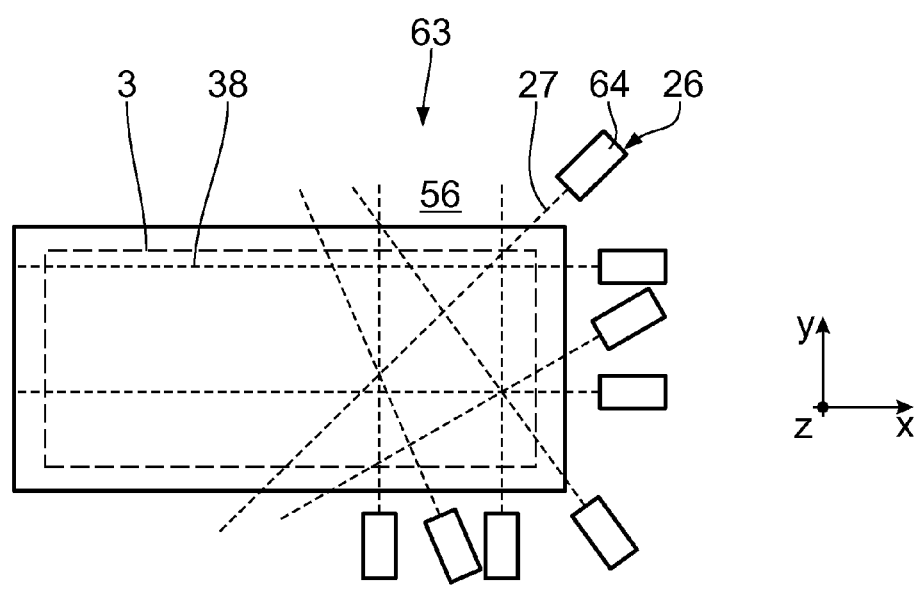

FIG. 9 schematically shows a meridional section through a further embodiment of an illumination system according to the invention within a further embodiment of a projection exposure apparatus for projection lithography comprising a further embodiment of an illumination optical unit, which comprises a mirror array comprising tilting actuators driven via a controller, and a raster module comprising a two-stage raster arrangement, and also a correction device for influencing an intensity of an illumination beam of the illumination system as part of a further embodiment of an illumination and displacement device;

FIG. 10 shows a further embodiment of a correction device for influencing the intensity of the illumination beam of one of the illumination systems; and FIG. 11 shows a further embodiment of a correction device for influencing the intensity of the illumination beam of one of the illumination systems.

Figure 12:
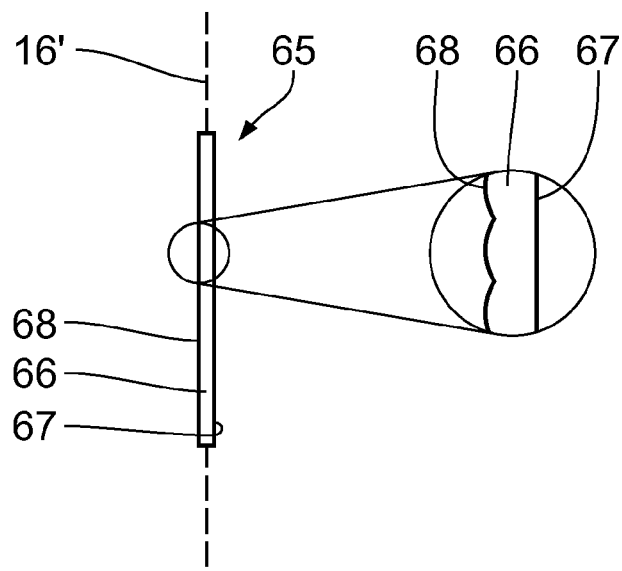
Figure 13:
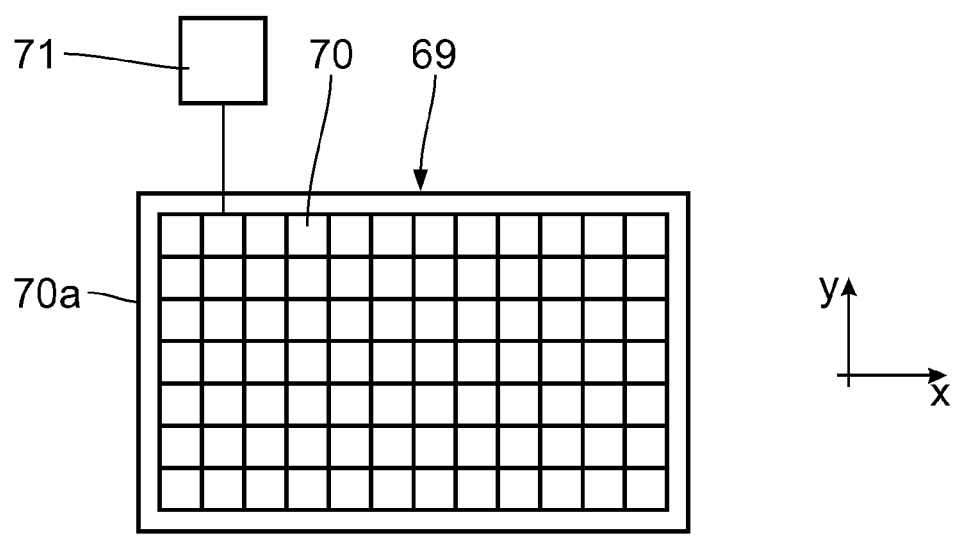
Figure 14:
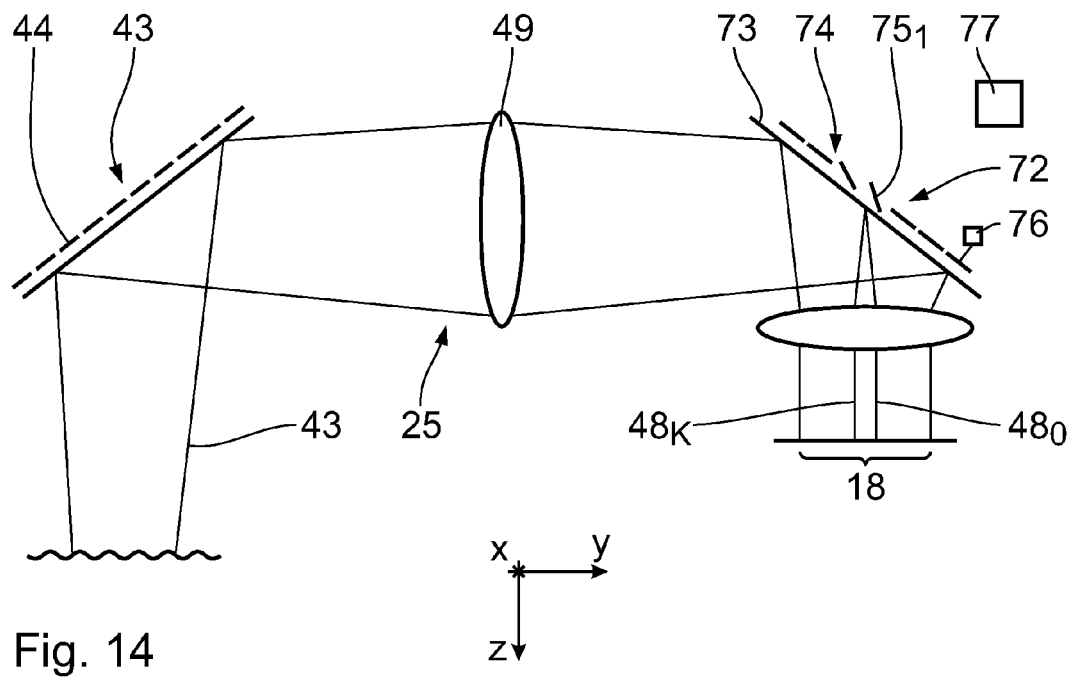
Figure 15:
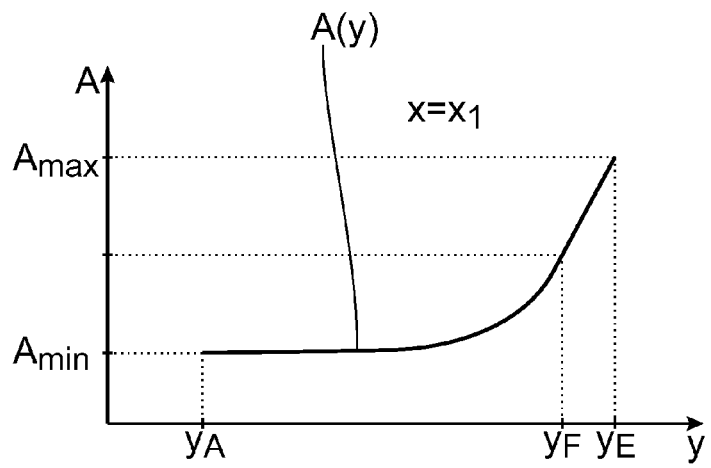
Figure 16:
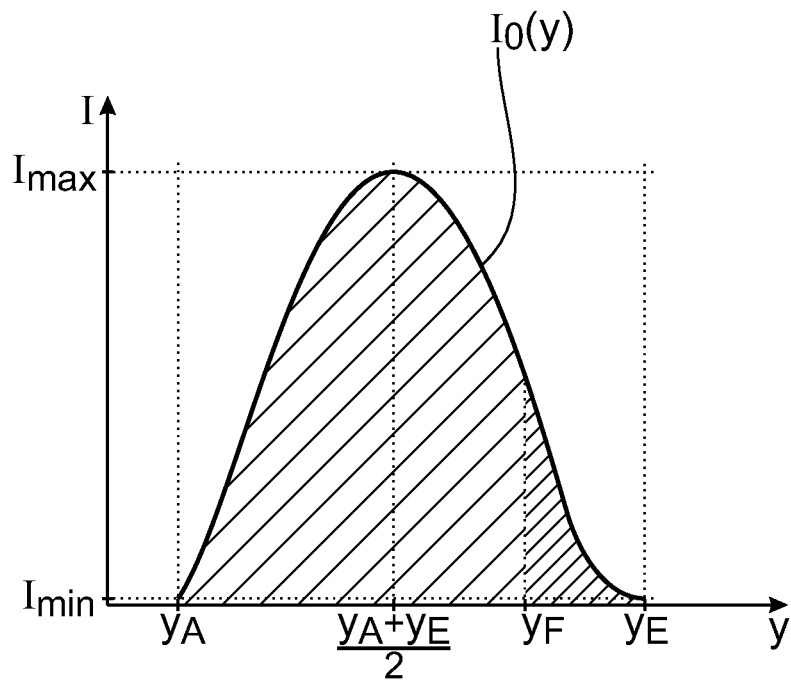
Figure 17:
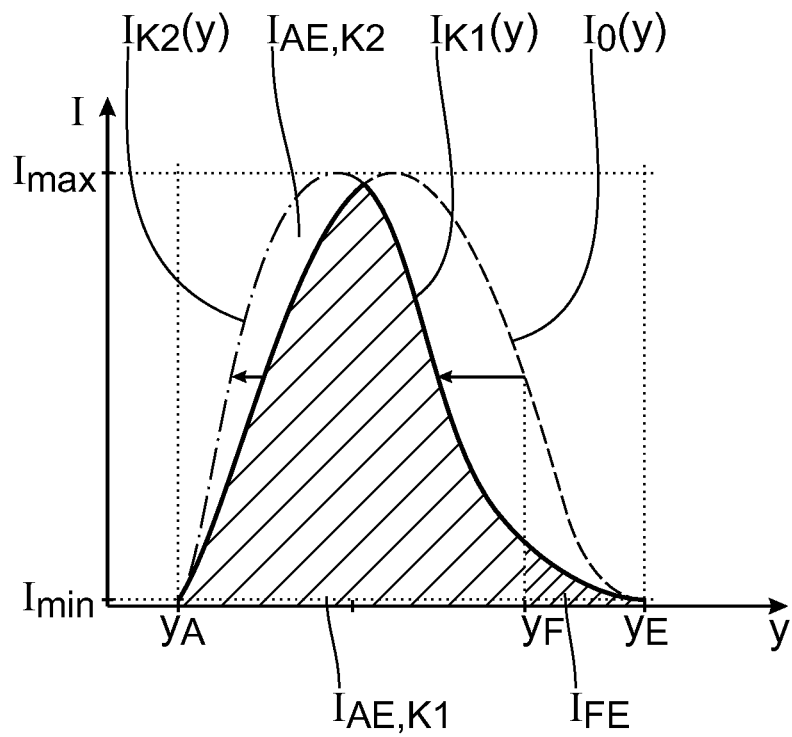
Figure 18:
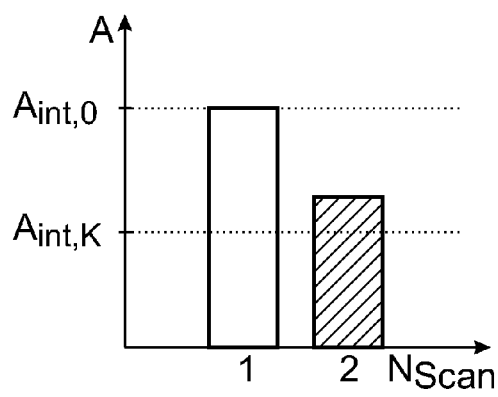
Figure 19:
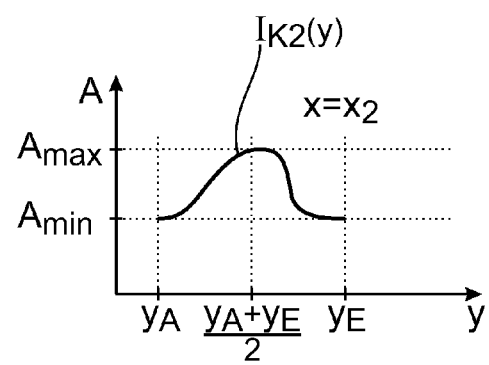
Figure 20:
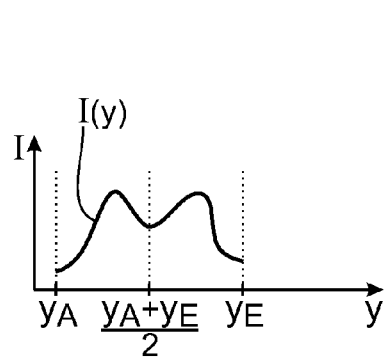
Figure 21:
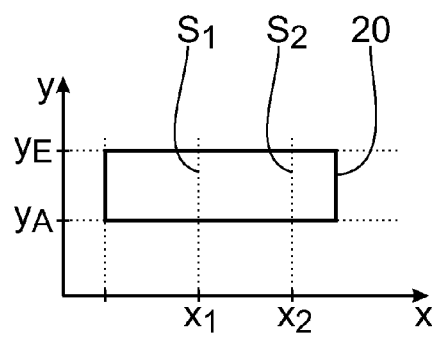
Figure 23:
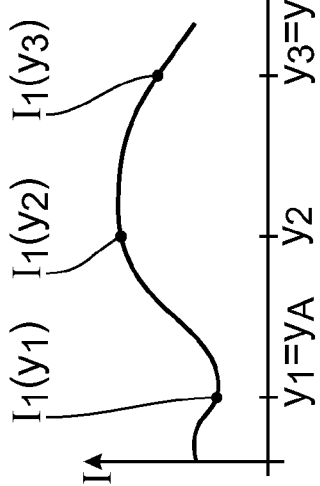
Figure 25:
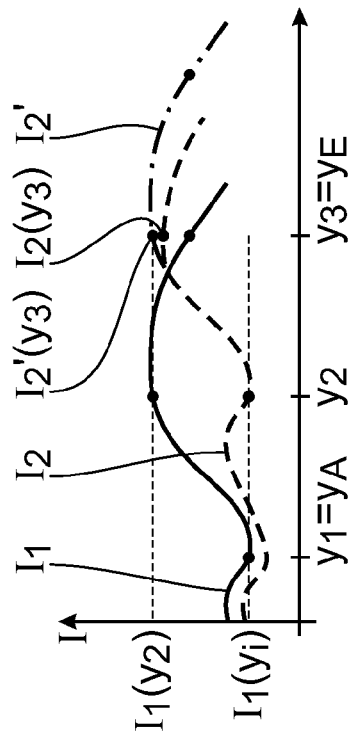
Figure 22:
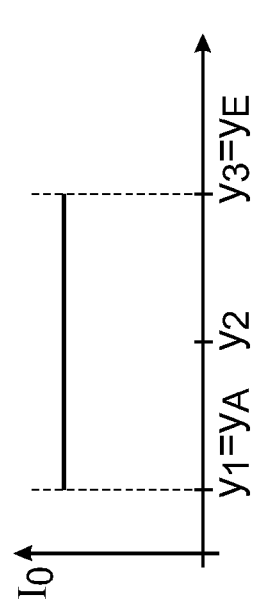
Figure 24:
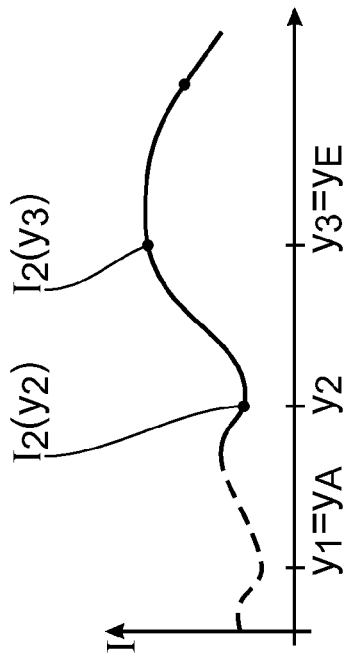

FIG. 12 shows a component of a correction device for influencing a field-resolved imaging, which can be used instead of the correction device according to FIG. 9;

FIG. 13 shows a further embodiment of a correction device for influencing the intensity of the illumination beam of one of the illumination systems;

FIG. 14 shows a further embodiment of a correction device for influencing the intensity of the illumination beam of one of the illumination systems;

FIG. 15 shows a diagram of the dependence of an imaging aberration parameter on an image field coordinate of an image field of one of the projection exposure apparatuses, the image field coordinate running parallel to an object displacement direction;

FIG. 16 shows a diagram of the dependence of an illumination intensity on the image field coordinate according to FIG. 15;

FIG. 17 shows, in an illustration similar to FIG. 16, a dependence—changed in comparison with FIG. 16—of the illumination intensity over the image field coordinate;

FIG. 18 shows a diagram of the imaging aberration parameter integrated over the image field coordinate for the two illumination intensity distributions according to FIGS. 16 and 17;

FIG. 19 shows a diagram of the dependence of the imaging aberration parameter on a further image field coordinate, which is likewise parallel to the object displacement direction;

FIG. 20 shows a diagram of the dependence of an illumination intensity on the image field coordinate according to FIG. 19;

FIG. 21 shows a plan view—not true to scale—of the image field of the projection exposure apparatus, wherein two scanning paths through the image field are highlighted;

FIG. 22 shows, in an illustration similar to FIG. 16, a dependence—not influenced by a correction device—of an illumination intensity on the image field coordinate according to FIG. 15;

FIG. 23 shows, in an illustration similar to FIG. 22, the dependence of the illumination intensity on the image field coordinate in a first influencing situation brought about by the correction device;

FIG. 24 shows, in an illustration similar to FIG. 22, the dependence of the illumination intensity on the image field coordinate in a second influencing situation brought about by the correction device; and FIG. 25 shows a superposition of the dependencies according to FIGS. 23 and 24, which allows a comparison of the intensities that are brought about by the correction device in the two influencing situations at three selected image field coordinates along the object displacement direction.

A projection exposure apparatus 1 for microlithography serves for producing a micro- or nanostructured electronic semiconductor component. The projection exposure apparatus 1 is operated in a high vacuum. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron can also be used for the light source 2. Information concerning such a light source can be found by the person skilled in the art in U.S. Pat. No. 6,859,515 B2, for example. EUV illumination light or illumination radiation in the form of an illumination or imaging light beam 3 is used for illumination and imaging within the projection exposure apparatus 1. As an alternative to the use of EUV illumination light, the projection exposure apparatus 1 can also use VUV or DUV illumination light for the projection exposure. When VUV or DUV illumination light is used, refractive optical components can also be used instead of the reflective optical components described below. Such a projection exposure apparatus comprising VUV or DUV illumination is known from DE 10 2006 042 452 A1 and WO 2009/087 805 A1.

The imaging light beam 3, downstream of the light source 2, firstly passes through a collector 4, which can be, for example, a nested collector having a multi-shell construction known from the prior art, or alternatively an ellipsoidally shaped collector then arranged downstream of the light source 2. A corresponding collector is known from EP 1 225 481 A2. Downstream of the collector 4, the EUV illumination light 3 firstly passes through an intermediate focal plane 5, which can be used for separating the imaging light beam 3 from undesirable radiation or particle portions. After passing through the intermediate focal plane 5, the imaging light beam 3 firstly impinges on a field facet mirror 6.

Figure 1:
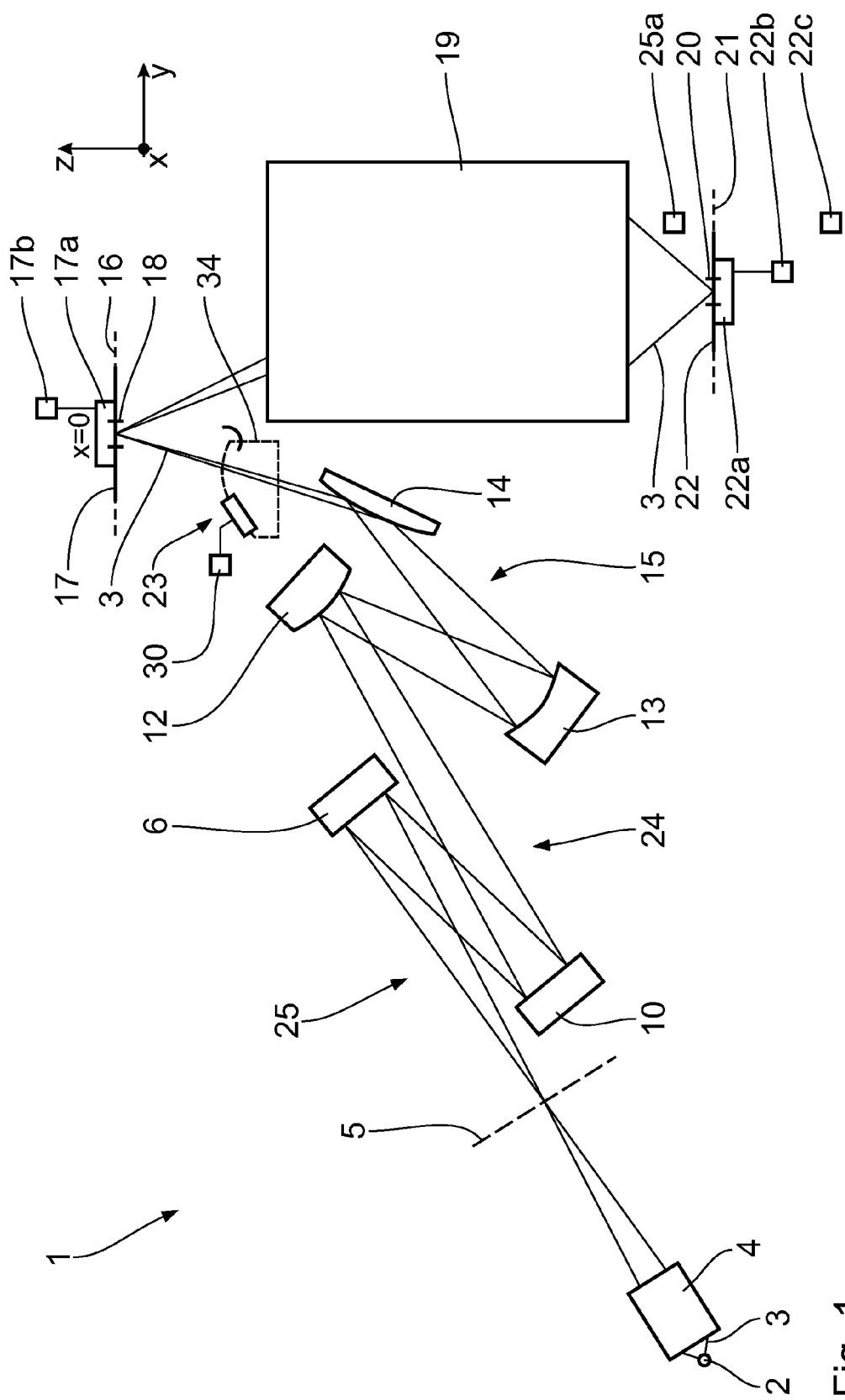
FIG. 1 shows schematically and with regard to an illumination optical unit in meridional section a projection exposure apparatus for projection lithography comprising an illumination and displacement device.

In order to facilitate the description of positional relationships, a Cartesian global xyz coordinate system is in each case depicted in the drawing. In FIG. 1, the x-axis runs perpendicularly to the plane of the drawing and out of the latter. The y-axis runs toward the right in FIG. 1. The z-axis runs upward in FIG. 1.

In order to facilitate the description of positional relationships for individual optical components of the projection exposure apparatus 1, a Cartesian local xyz or xy coordinate system is in each case also used in the following figures. The respective local xy coordinates span, unless described otherwise, a respective principal arrangement plane of the optical component, for example a reflection plane. The x-axes of the global xyz coordinate system and of the local xyz or xy coordinate systems run parallel to one another. The respective y-axes of the local xyz or xy coordinate systems are at an angle with respect to the y-axis of the global xyz coordinate system which corresponds to a tilting angle of the respective optical component via the x-axis.

Figure 6:
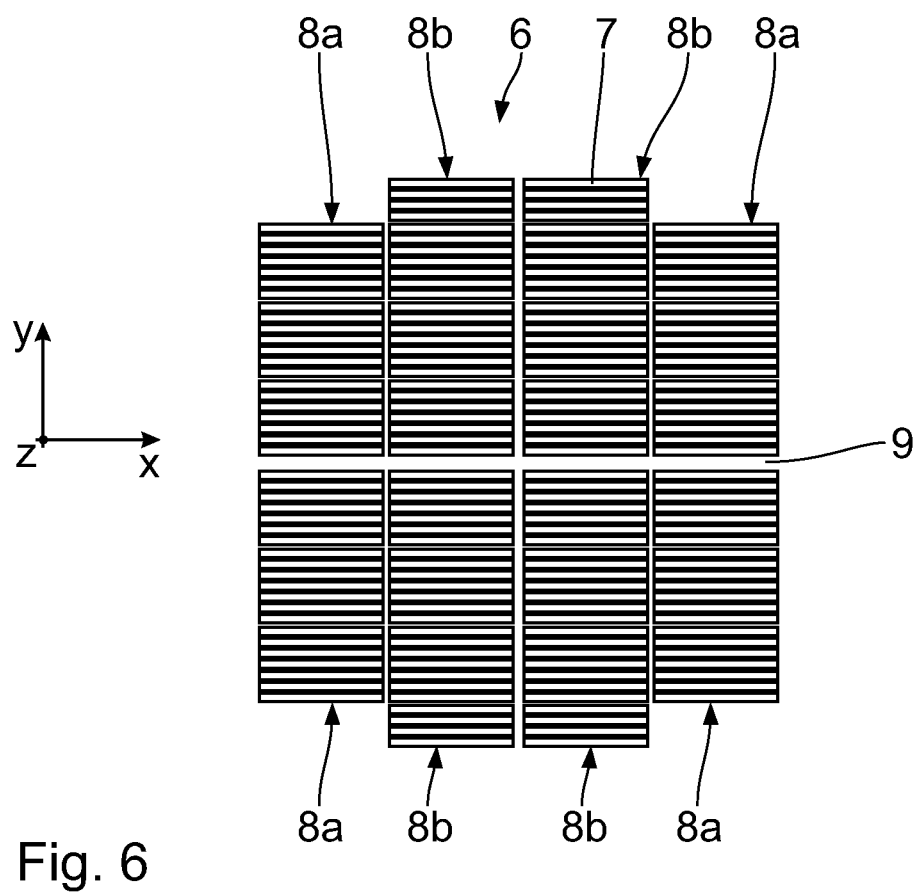
FIG. 6 shows a view of a facet arrangement of a field facet mirror of the illumination optical unit of the projection exposure apparatus according to FIG. 1.
Figure 8:
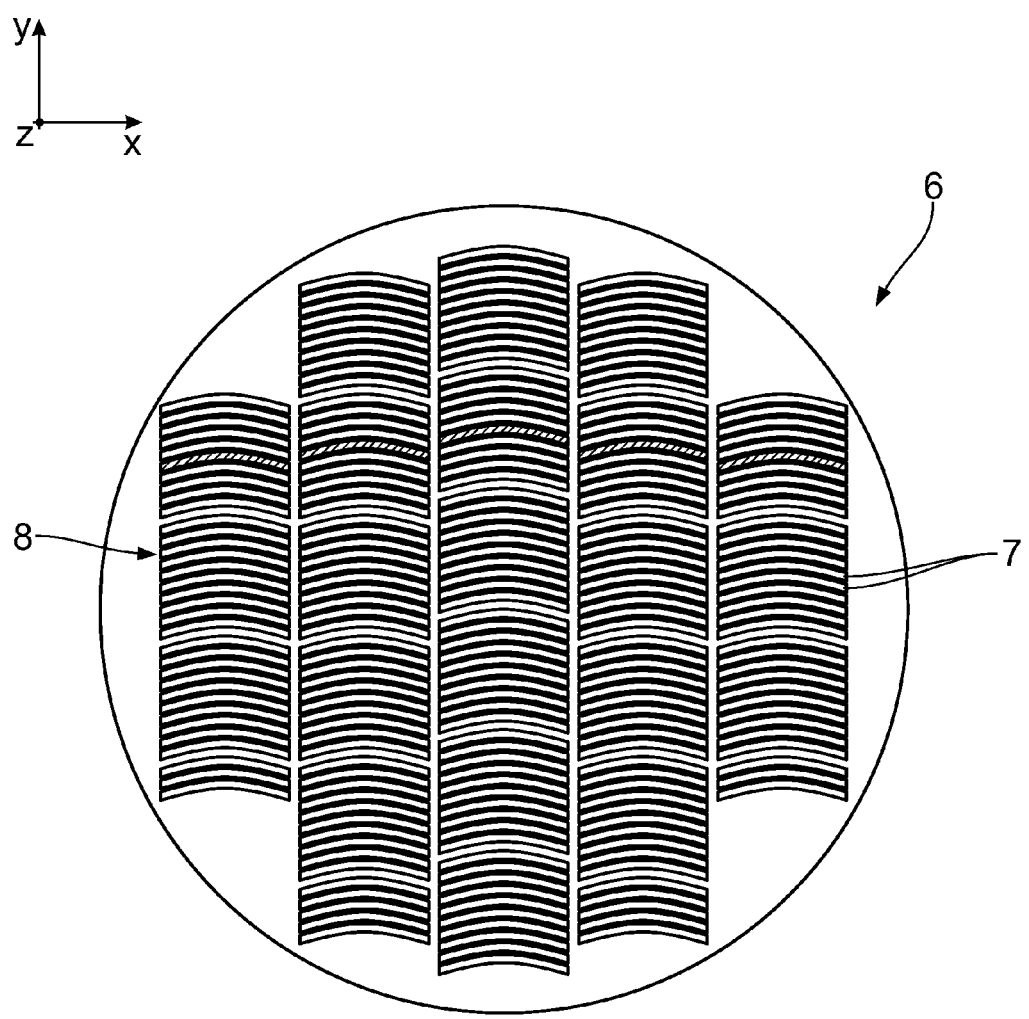
FIG. 8 shows, in an illustration similar to FIG. 6, a facet arrangement of a further embodiment of a field facet mirror.

FIGS. 6 and 8 show by way of example facet arrangements of field facets 7 of the field facet mirror 6. The field facets 7 are rectangular or curved and in each case have the same x/y aspect ratio. The x/y aspect ratio can for example be 12/5, can be 25/4 or can be 104/8.

The field facets 7 predefine a reflection surface of the field facet mirror 6 and are grouped into four columns each of six to eight field facet groups 8a, 8b. The field facet groups 8a in each case have seven field facets 7. The two additional marginal field facet groups 8b of the two central field facet columns in each case have four field facets 7. Between the two central facet columns and between the third and fourth facet rows, the facet arrangement of the field facet mirror 6 has interspaces 9 in which the field facet mirror 6 is shaded by holding spokes of the collector 4. In so far as an LPP source is used as the light source 2, corresponding shading can also be produced by a tin droplet generator, which is arranged adjacent to the collector 4 and is not illustrated in the drawing.

After reflection at the field facet mirror 6, the imaging light beam 3 split into imaging light partial beams assigned to the individual field facets 7 impinges on a pupil facet mirror 10. The respective imaging light partial beam of the entire imaging light beam 3 is guided along a respective imaging light channel.

Figure 7:
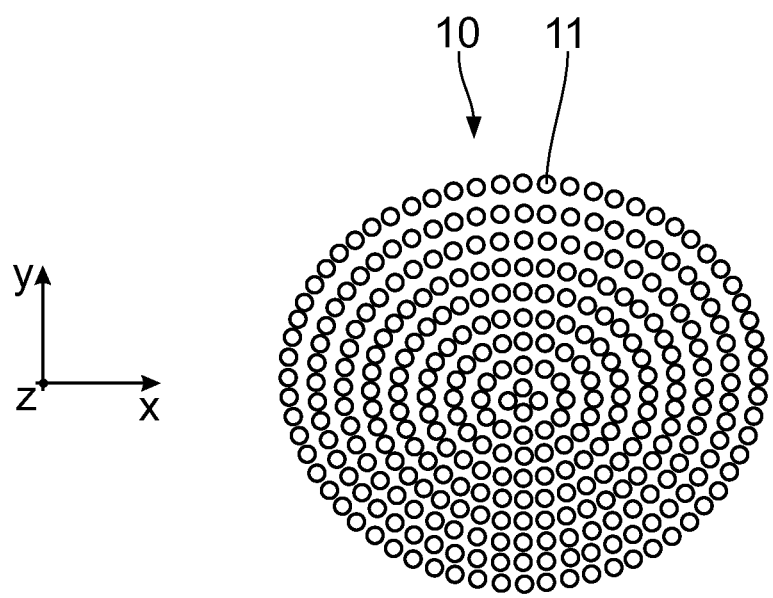
FIG. 7 shows a view of a facet arrangement of a pupil facet mirror of the illumination optical unit of the projection exposure apparatus according to FIG. 1.

FIG. 7 shows an exemplary facet arrangement of round pupil facets 11 of the pupil facet mirror 10. The pupil facets 11 are arranged around a center in facet rings lying one inside another. A pupil facet 11 is assigned to each imaging light partial beam of the EUV illumination light 3 which is reflected by one of the field facets 7, such that a respective facet pair impinged upon and comprising one of the field facets 7 and one of the pupil facets 11 predefines the imaging light channel for the associated imaging light partial beam of the EUV illumination light 3. The channel-wise assignment of the pupil facets 11 to the field facets 7 is effected in a manner dependent on a desired illumination by the projection exposure apparatus 1.

Via the pupil facet mirror 10 (FIG. 1) and a downstream transfer optical unit 15 consisting of three EUV mirrors 12, 13, 14, the field facets 7 are imaged into an object plane 16 of the projection exposure apparatus 1. The EUV mirror 14 is embodied as a mirror for grazing incidence (grazing incidence mirror). Arranged in the object plane 16 is a reticle 17, from which, with the EUV illumination light 3, an illumination region is illuminated which coordinates with an object field 18 of a downstream projection optical unit 19 of the projection exposure apparatus 1. The illumination region is therefore also designated as an illumination field 18. The imaging light channels are superimposed in the object field 18. The EUV illumination light 3 is reflected from the reticle 17. The reticle 17 is held by an object holder 17a, which is displaceable in a driven manner along an object displacement direction y during the illumination. An object holder drive 17b illustrated schematically in FIG. 1 serves for the driven displacement of the object holder 17a in the xy plane along the object displacement direction y.

The projection optical unit 19 images the object field 18 in the object plane 16 into an image field 20 in an image plane 21. Arranged in the image plane 21 is a wafer 22 as an example of a substrate, the wafer bearing a light-sensitive layer, which is exposed during the projection exposure via the projection exposure apparatus 1. The wafer 22, that is to say the substrate onto which imaging is effected, is held by a substrate holder 22a, which is displaceable along the displacement direction y synchronously with the displacement of the object holder 17a. A substrate holder drive 22b illustrated schematically in FIG. 1 serves for the driven displacement of the substrate holder 22a. During the projection exposure, both the reticle 17 and the wafer 22 are scanned in a synchronized manner in the y-direction. A synchronizing unit 22c serves for synchronizing the object holder drive 17b with the substrate holder drive 22b, the synchronizing unit being signal-connected to the object holder drive 17b and to the substrate holder drive 22b in a manner not illustrated in FIG. 1. The projection exposure apparatus 1 is embodied as a scanner. The scanning direction y is also designated as the object displacement direction.

A correction device 23 is arranged in the beam path of the illumination light beam 3 between the EUV mirror 14 and the object field 18. The correction device 23 serves for the influencing—which is spatially resolved over the object field 18—of an intensity of the illumination light beam 3 of an illumination system 24 of the projection exposure apparatus 1. The illumination system 24 comprises the light source 2, the collector 4 and an illumination optical unit 25, which also includes the EUV mirrors 12 to 14 alongside the two facet mirrors 6 and 10. The correction device 23 influences an xy intensity distribution of a cross section of an illumination light beam, as will be explained below with reference to FIGS. 2 to 5. This intensity influencing results in an influencing of an illumination intensity distribution over the entire object field 18 or at least over sections of the object field 18. The spatial resolution of the intensity influencing by the correction device 23 is provided at least along the scanning direction y, that is to say along the object displacement direction. If the correction device 23 is used in a DUV or VUV projection exposure apparatus, the correction device 23 can be arranged in the region of a reticle masking system (REMA) of the DUV or VUV illumination optical unit, for example directly upstream or directly downstream of a REMA diaphragm. Together with the illumination optical unit 25, the object holder 17a and the object holder drive 17b, the correction device 23 forms an illumination and displacement device for the projection exposure apparatus 1. The projection optical unit 19, the substrate holder 22a, the substrate holder drive 22b and the synchronizing unit 22c together with the illumination and displacement device form an optical system.

Furthermore, the projection exposure apparatus 1 comprises a measuring device 25a for the spatially resolved measurement of a wavefront of the imaging light 3 over the image field 20. The spatial resolution of this wavefront measurement is provided at least along the object displacement direction, that is to say along the scanning direction y.

The measuring device 25a can carry out a wavefront measurement over the complete image field 20 or over a part of the image field 20 and then interpolate the measured values thus obtained to the complete image field 20. Examples of such measuring devices 25a are given in U.S. Pat. No. 7,333,216 B2 and U.S. Pat. No. 6,650,399 B2. Partial field or full field measurements of the wavefronts can be performed at different, for example cyclically recur-ring instants. In the case of a partial field measurement over the image field 20, it is possible to use, for example, (x,y) measurement point arrays in the form of a (13, 3) array, a (13, 5) array or a (13, 7) array. It is likewise possible just to measure for example one field point (preferably the field center), three field points (preferably the field center and the field centers of the respective left and right field halves), five field points or else a different number of field points. Afterward, an extrapolation to one of the field point arrays, for example a (13, 3), (13, 5) or (13, 7) array, can then be effected. The number of measured field points can also vary from measurement instant to measurement instant. In the case of fields which, for example, are crescent-shaped or have a boundary that is different from rectangular, instead of field points in a field center or in a field half for the wavefront measurement it is also possible to use other characteristic field points, chosen depending on the field shape. Instead of a measurement of the wavefront over the image field 20, a simulation calculation with respect to the wavefront can also be effected, proceeding from the optical design data. In this case, the heating of the optical components carrying the illumination or imaging light 3, for example mirror or lens element heating, can be taken into account. As an alternative to a simulation calculated overall, it is possible to correct a simulation calculation model via customary standard methods, for example via a Levenberg-Marquardt algorithm, for optimizing the wavefront determination. In the context of the simulation calculation, it is also possible to use a feedforward model, for example a linear extrapolation. The simulation calculations and full field or partial field wavefront measurements over the image field 20 can be used complementarily to one another.

Figure 2:
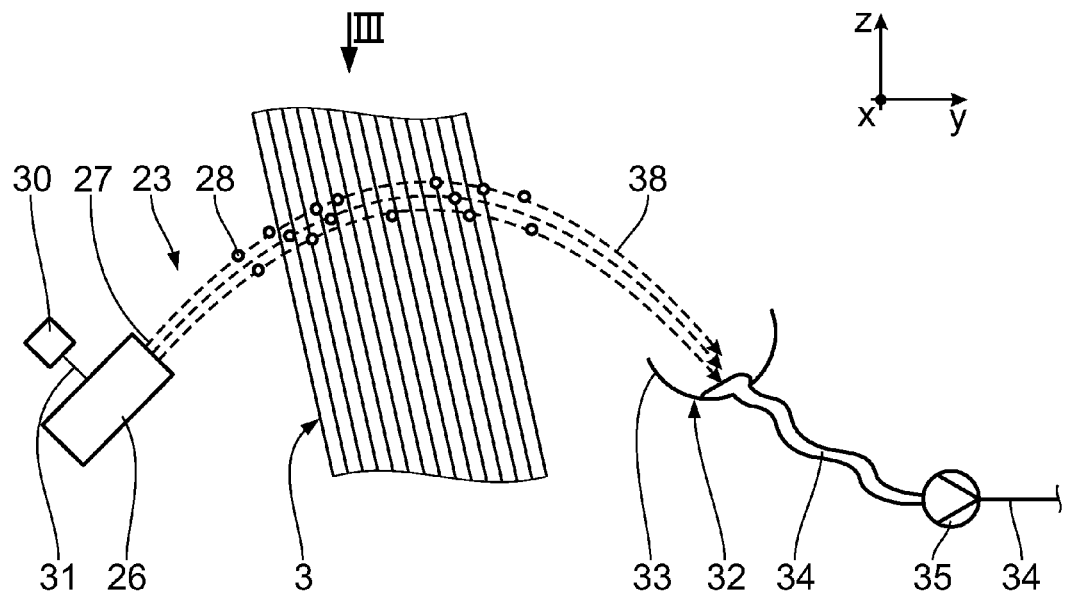
FIG. 2 shows in an enlarged manner a correction device for influencing an intensity of an illumination light beam of an illumination system of the projection exposure apparatus according to FIG. 1, wherein the illumination light beam has a deviating ray direction in comparison with the illustration according to FIG. 1.
Figure 3:
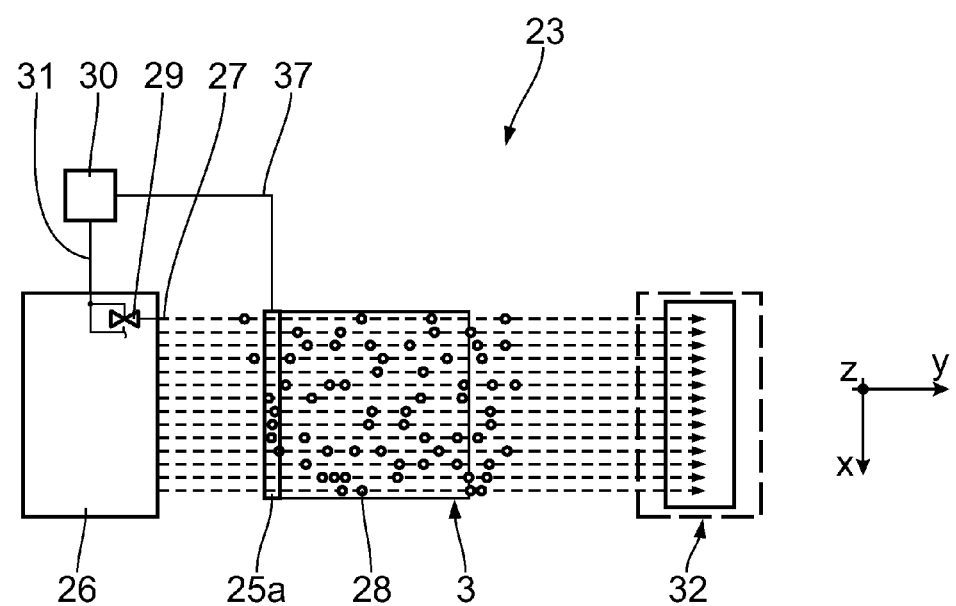
FIG. 3 shows a view of the correction device from viewing direction III in FIG. 2.

FIGS. 2 and 3 show the correction device 23 in an enlarged manner in comparison with FIG. 1. The correction device has an ejection device 26 comprising a plurality of ejection channels 27 for attenuating bodies 28 in the form of droplets. The attenuating bodies 28 are also discrete microdroplets in the flight direction, that is to say droplets having a diameter in the range of between 1 μm and 1000 μm. The diameter of the attenuating bodies 28 can be, for example, 10 μm, 25 μm, 50 μm or 100 μm. The attenuating bodies 28 are mercury droplets. The ejection channels 27 are present in the form of micro-ejection nozzles, such as are known, in principle, in connection with ink jet printers. The width of an entire row of the ejection channels 27 is adapted to the width of the illumination light beam 3 in the x-direction, such that attenuating bodies 28 can fly through the entire xy cross section of the illumination light beam 3.

The following holds true for the velocity v of the attenuating bodies 28: v≈50 m/s. Depending e.g. on the size and material of the attenuating bodies 28 and e.g. depending on ambient parameters, other velocities can also arise.

The ejection channels 27 of the ejection device 26 are arranged in the form of a 3×14 array. As is evident from FIG. 2, three array rows are present in a manner spaced apart from one another in the z-direction. A total of 14 array columns are present in a manner spaced apart from one another in the x-direction. A different array or column arrangement of the ejection channels 27 is also possible in variance of the ejection device 26, for example a column comprising M ejection channels 27 which are spaced apart from one another in the x-direction, wherein M can be in the range of between 10 and 500. Correspondingly, it is also possible to arrange one to ten channel rows, for example.

By way of example, more than 1000 ejection channels 27 situated alongside one another, for example 3000 ejection channels 27, can be present in the x-direction. The channel rows adjacent to one another in the z-direction can be offset relative to one another in the x-direction in order to increase an x-resolution of the ejection device 26.

It is also possible for 100 channel rows or even more channel rows to be present. The correction device 23 is arranged in proximity to a field plane of the projection optical unit 19. From the influencing of the intensity distribution over the cross section of the illumination light beam 3, there then results a corresponding intensity distribution of the illumination of the object field 18. The intensity-influencing effect of the correction device 23 on the cross section of the illumination light beam 3, that is to say the effect of the correction device 23 on the intensity of the illumination of the illumination field 18, is such that inner sections of the illumination field 18 can be influenced without the influencing of outer sections surrounding the inner sections. Since the speed of light is very much greater than the flight velocity of the attenuating bodies 28, an illumination pulse of the illumination light beam 3 sees in each case a snapshot of a distribution of the attenuating bodies 28 over the illumination light beam 3. It is thus possible, via a corresponding distribution of the attenuating bodies 28, to attenuate in particular inner, central sections of the cross section of the illumination light beam 3, while for example an entire circumferential edge region of the cross section remains uninfluenced.

In an alternative arrangement of the correction device 23, the trajectory 38 of the attenuating bodies 28 through the illumination light beam 3 does not run in proximity to a field plane of the illumination optical unit 25 or of the projection optical unit 19, as in the case of the arrangement of the correction device 23 according to FIG. 1, but rather in proximity to a pupil plane of the illumination optical unit 25 or of the projection optical unit 19, in particular in proximity to the pupil facet mirror 10. Such an arrangement makes it possible to achieve a defined influencing of an illumination angle distribution of the illumination of the object field 18 by using the correction device 23.

In an embodiment of the correction device 23 which is not illustrated, instead of droplets as the attenuating bodies 28 solids, for example microparticles, are ejected by the ejection device 26 and collected by the collecting device 32. In principle, plasma or gas pulses can also be ejected as attenuating bodies.

A fluid line (not illustrated in specific detail in the drawing) leads to each of the ejection channels 27. A drivable valve 29 is in each case arranged in the line path upstream of the nozzle ends of the ejection channels 27. Such a valve 29 is assigned to each of the ejection channels 27. One of the valves 29 is illustrated by way of example in FIG. 3. Via the valves 29, the ejection channels 27 can be driven independently of one another by a control device or open-loop/closed-loop control device 30 of the correction device 23. For this purpose, the control device 30 is signal-connected to the valves 29 of the ejection channels 27 via a multipole signal line 31, as illustrated schematically for one of the valves 29 in FIG. 3. The control device 30 serves for predefining ejection instants for ejecting a respective attenuating body 28 from a respective one of the ejection channels 27. This predefinition of ejection instants is also known, in principle, from the technology of inkjet printers. The control device 30 is also signal-connected to the synchronizing unit 22c, this not being illustrated in FIG. 1. Moreover, the control device 30 is signal-connected to the measuring device 25a, this not being illustrated in FIG. 1.

The correction device 23 furthermore comprises a collecting device 32 for the ejected attenuating bodies 28. On the path between the ejection device 26 and the collecting device 32, the attenuating bodies 28 fly through the illumination light beam 3, as illustrated in FIGS. 2 and 3. In this case, FIG. 2 shows a part of the illumination light beam 3 in a side view, wherein a ray angle deviates from the ray angle shown in FIG. 1. FIG. 3 shows the illumination light beam 3 in cross section.

The collecting device 32 has a collecting pan 33 and a discharge line 34 for discharging the collected attenuating bodies 28. A circulating pump 35 is arranged in the discharge line 34. Via the discharge line 34, the collecting device 32 is fluid-connected to the ejection device 26, as illustrated schematically in a dashed fashion in FIG. 1. In this case, the discharge line 34 is routed such that it is routed past the beam path of the illumination light beam 3. A closed circuit of the mercury forming the attenuating bodies 28 is provided via the discharge line 34.

In the embodiment according to FIG. 3, the measuring or detection device 25a is embodied as a linear sensor array comprising detection elements which are displaceable in the y-direction, are lined up alongside one another in the x-direction and are sensitive to the EUV light of the illumination light beam 3. The detection device 25a is signal-connected to the control device 30 via a multipole signal line 37.

Figure 4:
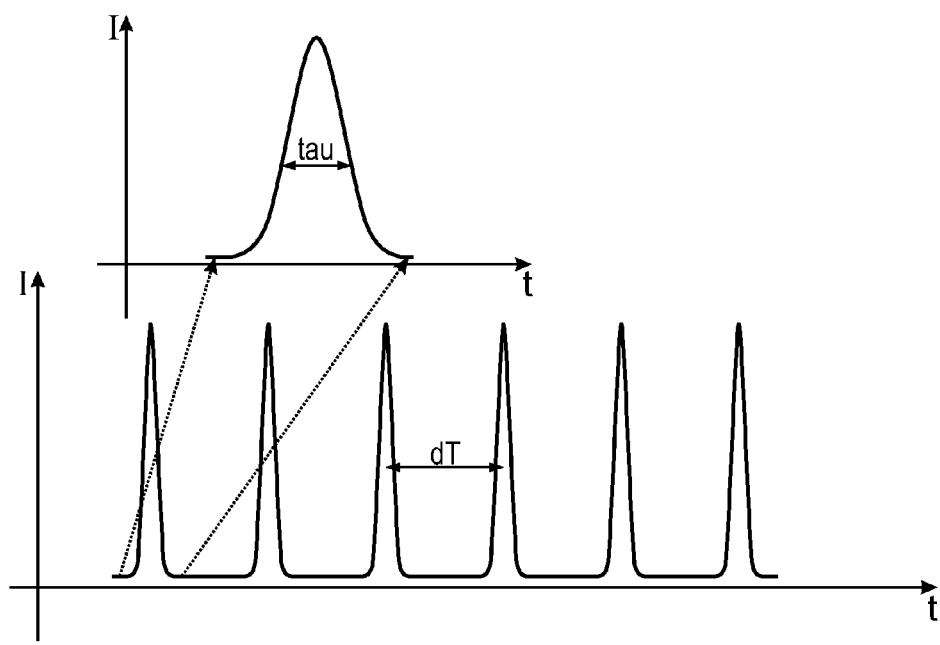
FIG. 4 shows a temporal intensity profile of a pulsed EUV light source of the illumination system, wherein the temporal intensity profile of one of the light pulses is illustrated in a second diagram with higher temporal resolution.

FIG. 4 shows a temporal profile of an emission of the EUV light source 2, which is embodied as a pulsed light source. The pulse duration tau is approximately 50 ns. A pulse frequency of the light source 2 is 6 kHz. Alternatively, the pulse frequency of the light source 2 can be up to 100 kHz. In the case where a VUV light source is used instead of the EUV light source 2, the pulse duration tau is approximately 150 ns and the pulse frequency is 6 kHz. The temporal separation dT between two temporally successive light pulses is accordingly just under 2 ms. A duty cycle tau/dT is therefore approximately $10^{-4}$.

After being ejected from a respective one of the ejection channels 27, the attenuating bodies 28 fly on parabolic trajectories 38, the curvature of which is highly exaggerated in FIG. 2.

A flight velocity of the attenuating bodies 28 through the illumination light beam 3 is adapted to the pulse frequency of the light source 2.

Figure 5:
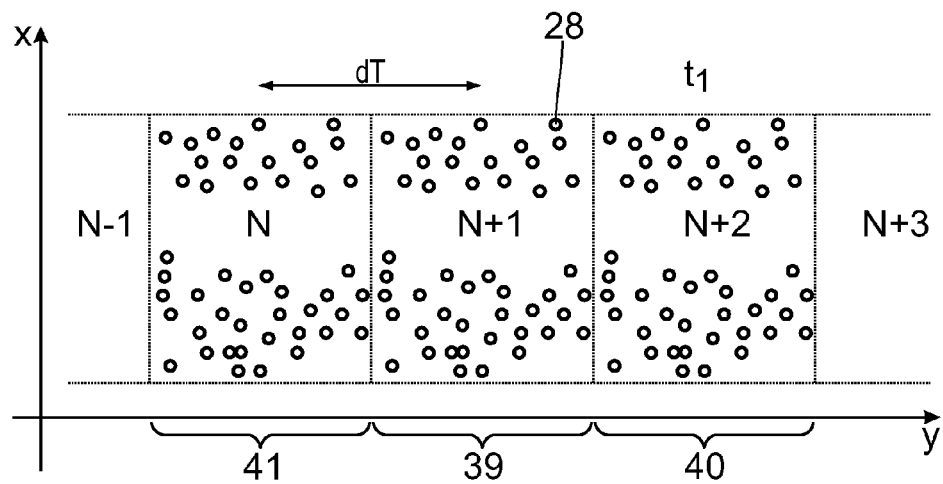
FIG. 5 shows, from a viewing direction corresponding to the viewing direction according to FIG. 3, a spatial distribution of attenuating bodies in the form of droplets, wherein the distributions with respect to three successive light pulses of the illumination light are specifically illustrated.

This adaptation is such that each EUV light pulse sees an xy droplet distribution generated specially for the light pulse via the driving of the ejection channels 27 by the control device 30. In this case, the temporal relationship is similar to that in a stroboscope. The driving can in this case be such that each EUV light pulse sees exactly the same xy droplet distribution. This is used for example in the case of low pulse frequencies of the light source 2. Exactly identical xy droplet distributions are illustrated in FIG. 5 for three successive EUV light pulses N, N+1 and N+2. At the instant $t_1$ considered, by way of example, an xy attenuating body distribution 39 covers the EUV light pulse N+1. The EUV light pulse N+1 is therefore attenuated two-dimensionally, that is to say in the x- and y-directions at defined points, namely where the attenuating bodies 28 are currently present. The position of the attenuating bodies 28 is predefined by corresponding temporal driving of the valves 29 of the ejection channels 27. At the instant $t_1$, an attenuating body distribution 40 that attenuated the temporally preceding EUV light pulse N+2 has already flown a corresponding y-distance further in the direction toward the collecting device 32. At the same instant $t_1$, a further attenuating body distribution 41 has already left the ejection channels 27 and flies toward the cross section of the illumination light beam 3 in order to be there when the succeeding EUV light pulse N arrives.

The driving in the case of the attenuating body distribution according to FIG. 5 is such that the EUV light pulses N, N+1 and N+2 see the same attenuating body distribution.

An x-position of the attenuating bodies 28 is predefined by the driving of the valve 29 of the ejection channel 27 present in the respective column. A y-position is predefined by corresponding temporal driving of the valve 29 of the ejection channel 27. If, in the same x-position, a plurality of attenuating bodies 28 are intended to be present at different y-positions, either the same ejection channel 27 can be driven in very close succession or different ejection channels 27 of the same column, that is to say ejection channels 27 which are spaced apart from one another in the z-direction and which have the same or an at least closely adjacent x-coordinate, can be driven with a corresponding temporal delay.

A density of the attenuating bodies 28 in the y-direction is therefore defined by an attenuating body flight time. The relationship y=dT/v holds true, wherein v is a flight velocity of the attenuating bodies 28.

In the x- and y-directions it is possible to achieve a positioning accuracy of the attenuating body distribution (cf. attenuating body distributions 39, 40, 41 in FIG. 5) of approximately 10 μm. One of the ejection channels 27 can produce 25 000 of the attenuating bodies 28 per second.

The correction device 23 operates as follows: the detection device 25a measures a wavefront of the illumination light beam 3 either in a manner only spatially resolved in the y-direction or over the entire beam cross section, that is to say over the x- and y-directions. This actual wavefront is compared with a predefined desired wavefront. This comparison takes place in the control device 30. Depending on the result of this comparison, the control device 30 drives the corresponding valves 29 of the ejection channels 27 of the ejection device 26 and predefines a corresponding attenuation of the illumination light beam 3 via the attenuating body distribution produced over the cross section of the illumination light beam 3. The attenuating bodies 28 attenuate the EUV illumination light beam 3 in each case locally by absorption or scattering. This attenuation can be predefined in a spatially resolved manner in the y-direction or else two-dimensionally, that is to say over the x- and y-directions in a defined manner.

The method of operation of the illumination and displacement device is explained in greater detail below with reference to FIGS. 15 to 20:

FIG. 15 shows the image field dependence of an imaging aberration parameter A on the object displacement direction y along a y image field coordinate, that is to say for a fixed x-value $x=x_1$. In FIG. 21, this is clarified for the schematically illustrated image field 20. The A(y) diagram in FIG. 15 therefore shows the profile of the imaging aberration parameter A along a scanning path $S_1$, which is also designated hereinafter as $y_A y_E$. An image of a point on the reticle 17 enters into the image field 20 during scanning along the scanning path $S_1$ at the location $x_1$, $y_A$ and emerges again from the image field 20 at the location $x_1$, $y_E$. The imaging aberration parameter A can be a distortion or some other imaging aberration that impairs the imaging quality. Combinations and, in particular, weighted combinations of different imaging aberrations (distortion, astigmatism, coma, spherical aberration, Petzval curvature or higher-order aberrations) are also possible. Along the scanning path $S_1$, the imaging aberration parameter A firstly stays close to a minimum value $A_{min}$ and then rises nonlinearly up to a maximum value $A_{max}$ at the end of the scanning path $S_1$. The rise in the imaging aberration parameter to values significantly greater than $A_{min}$ begins along the scanning path $S_1$ above a y-value of $y_F$.

FIG. 16 shows a first intensity scanning profile $I_0(y)$ of the illumination light 3 along the scanning path $S_1$ at $x=x_1$. The scanning profile has approximately the form of a Gaussian distribution, wherein a minimum intensity value $I_{min}$ is achieved at $y=y_A$ and at $y=y_E$ and a maximum intensity value $I_{max}$ is achieved at $(y_A+y_E)/2$. The ratio $I_{max}/I_{min}$ can assume values in the range of between 1.1 and 100, in particular between 1.1 and 20.

Along the scanning path portion $y_F y_E$, the image point of the reticle point to be imaged is impinged upon with an intensity portion of the entire intensity scanning profile which is hatched in FIG. 16 and is designated by $I_{FE}$. For the ratio $I_{FE}/I_{AE}$ between the scan-integrated total intensity $I_{AE}$ and the scan-integrated intensity portion $I_{FE}$, it holds true that, for example, $I_{FE}/I_{AE} \cong 0.2$.

FIG. 17 shows in a solid fashion the scanning profile intensity ratios $I_{K1}(y)$ along the scanning path $S_1$ at $x=x_1$ after the corrective effect of correction device 23. Along the scanning path $S_1$, a strong intensity attenuation has taken place as a result of the attenuation via the attenuating bodies 28 in the region $y_F y_E$. FIG. 17 also illustrates in a dashed fashion the intensity profile $I_0(y)$ over the scanning profile $S_1$ without any influence of the attenuating bodies 28. The scan-integrated total intensity after influencing by the correction device is designated as $I_{AE,K1}$.

Since the correction device 23, via attenuating bodies 28, can influence the illumination light beam 3 in such a way that inner sections of the illumination field 18 can be influenced without the influencing of outer sections surrounding the inner sections, it is possible, for example, for a start and an end of the scanning path $S_1$ to remain substantially uninfluenced, whereas the illumination light beam 3 which illuminates inner sections of the illumination field 18 is attenuated.

The ratio $I_{FE}/I_{AE}$, that is to say the proportion of that scan-integrated illumination light intensity which sees a larger imaging aberration, has decreased significantly on account of the intensity attenuation in particular in the section $y_F y_E$ of the scanning path $S_1$ and is approximately $I_{FE}, I_{AE}, K_1=0.05$.

FIG. 18 illustrates the influence of the effect of the correction device 23 on the aberration $A_{it}$ integrated over the scanning path $S_1$.

The following holds true: $A_{int} = \int_{y_A}^{y_E} A(y)I(y)dy$

In the case of the scanning profile $I_0(y)$ according to FIG. 16, the integrated scanned aberration $A_{int,0}$ is approximately double the integrated scanned aberration $A_{int,K}$ in the case of the intensity scanning profile $I_{K1}(y)$ according to FIG. 17.

FIGS. 19, 20 illustrate by way of example the aberration-reducing effect of the correction device 23 in the case of a second scanning path $S_2$ (cf. FIG. 21) at $x=x_2$. Here the imaging aberration parameter A has its maximum at $(y_A+y_E)/2$. Toward the two edges of the scanning path $S_2$, the imaging aberration parameter A falls in an approximately Gaussian fashion to a value $A_{min}$. The intensity scanning profile $I_{K2}(y)$ according to FIG. 20 takes account of this profile of the imaging parameter according to FIG. 19. The scanning profile has an intensity dip at the scanning point $(y_A+y_E)/2$, such that the highest imaging aberration values contribute only with lower intensity. This in turn results in comparison with a Gaussian intensity impingement in accordance with FIG. 16 in a reduction of the scan-integrated aberration $A_{int}$.

In the same way, an aberration can also be produced in a targeted manner by variation of the scanning profile. This can be used for correction or compensation purposes, that is to say for example for correcting a wavefront aberration detected during an adjustment of the optical system or during the operation of the projection exposure apparatus.

Proceeding from imaging aberration data that are available, measured or calculated, and are spatially resolved over the image field 20, the associated scanning profiles I(y), that lead to a corresponding reduction of the scan-integrated aberration can be found, for example, with the aid of the Radon transformation. For this purpose, it is possible to use suitable discretizations of an analytical inversion formula for the adjoint Radon transformation that results in the required intensity distribution I (x, y) over the field. Corresponding algorithms are described in W. H Press, S. A. Teukolsky, W. T. Vetterling, B. P. Flannery, "Numerical Recipes in C", Cambridge University Press, 2002, chapters 3 and 4. In this case, it is possible to use convex programming algorithms that can be taken from the reference book Stephen Boyd, Lieven Vandenberghe, "Convex Optimization", Cambridge University Press, 2004, or Walter Alt, "Nichtlineare Optimierung", Vieweg, 2002 and also Frank Natterer, "The Mathematics of Computerized Tomography", John Wiley & Sons, 1986, in particular sections II.1 and II.2, pages 9 to 30. The assignment problem formulated via these algorithms can be solved by standard methods, e.g. sequential quadratic programming (SQP), that are part of the repertoire of conventional mathematics programs, e.g. Matlab®. In the course of imaging aberration minimization along the different scanning paths $S_1$ $S_2$ . . . $S_n$, it is possible to take account of the secondary condition that the scan-integrated intensity is identical for each x-value. In the formulation of the assignment problem of an intensity function I(y) to an aberration function A(y), it is possible to have recourse to hierarchical target achieving specifications described in WO 2010/034674 A1.

On the basis of customary design methods for the construction of projection lenses which are known from the prior art, new design methods for optics can result by using the effect of an illumination intensity scanning profile I(y) on the scanning dependence A(y) of the imaging aberration parameter. This takes account of the fact that it is possible to compensate for specific imaging aberration dependencies A(y) by way of suitable intensity scanning profiles I(y). In such design methods, firstly a standard variation of the intensity scanning profile I(y) is preselected. Afterward, a sensitivity s of the correction device is calculated by an optical design having an unvaried scanning profile, for example having the scanning profile $I_0(y)$ according to FIG. 16, being compared with a design having a varied scanning profile $I_K(y)$. In this case, the sensitivity s represents a vector, wherein the individual vector coordinates represent imaging aberration parameters, for example coefficients of a development of an imaging aberration, according to field-point-resolved Zernike polynomials. After difference formation has been carried out, the correction effect on the imaging aberration is assessed. The assessment or merit function can comprise additional, weighting terms. The correction device 23 is then set so as to result in the required intensity scanning profile $I_K(y)$ for the correction of the imaging aberration.

Via this manner of operation of the correction device 23, design-dictated imaging aberrations dependent on the y-coordinate of the image field 20 or else, for example thermal drifts in the illumination system 24 or in the projection optical unit 19 or an instability of the light source 2 can be corrected.

A further embodiment of an illumination system for use in a projection exposure apparatus and two further embodiments of correction devices for influencing the intensity of the illumination beam of the illumination system are described below with reference to FIGS. 9 to 11. Components corresponding to those which have already been explained above with reference to FIGS. 1 to 8 bear the same reference numerals and will not be discussed in detail again.

In the case of the projection exposure apparatus 40a according to FIG. 9, which can be used instead of the projection exposure apparatus 1 according to FIG. 1, some optical components under FIG. 9 are illustrated schematically as refractive rather than reflective components. In so far as such refractive components are actually used, the projection exposure apparatus 40a is operated with illumination or imaging light 3 having wavelengths in the deep ultraviolet range (DUV or VUV).

In order to facilitate the representation of positional relationships, a Cartesian xyz coordinate system is reproduced in FIGS. 9 to 11. In FIG. 9, the x-direction runs perpendicularly to the plane of the drawing and into the latter. The y-direction runs upward in FIG. 9. The z-direction runs toward the right in FIG. 9.

A scanning direction of the projection exposure apparatus 40a runs in the y-direction, that is to say in the plane of the drawing in FIG. 9. In the meridional section illustrated in FIG. 9, the majority of the optical components of the projection exposure apparatus 40a are lined up along an optical axis 41a running in the z-direction. It goes without saying that the optical axis 41a can also be folded in ways other than that shown in FIG. 9, in particular in order to make the projection exposure apparatus 40a compact.

The illumination system of the projection exposure apparatus 40, the illumination system being designated overall by 24, serves for the defined illumination of the object field or illumination field 18 in the object plane or reticle plane 16, in which is arranged a structure to be transferred in the form of a reticle (not illustrated in more specific detail). The illumination system 24 comprises the primary light source 2 and the illumination optical unit 24 with the optical components for guiding the illumination or imaging light 3 toward the object field 18. The primary light source 2 is an ArF laser having an operating wavelength of 193 nm, the illumination light ray of which is aligned coaxially with respect to the optical axis 41. Other UV light sources, for example an $F_2$ excimer laser having an operating wavelength of 157 nm, a KrF excimer laser having an operating wavelength of 248 nm and primary light sources having higher or lower operating wavelengths are likewise possible.

A ray of the illumination light 3 that comes from the light source 2 and has a small rectangular cross section firstly impinges on a beam expanding optical unit 42, which generates an emerging ray of the illumination light 3 comprising substantially parallel light and having a larger rectangular cross section. The beam expanding optical unit 42 can contain elements that reduce undesirable effects of the coherence of the illumination light 3. The illumination light 3 substantially parallelized by the beam expanding optical unit 42 subsequently impinges on a micromirror array (multi mirror array, MMA) 43 for generating an illumination light angular distribution. The micromirror array 43 has a multiplicity of rectangular individual mirrors 44 arranged in an xy grid. Each of the individual mirrors 44 is connected to an associated tilting actuator 45. Each of the tilting actuators 45 is connected via a control line 46 to a controller 47 for driving the actuators 45. The actuators 45 can be driven independently of one another via the controller 47. Each of the actuators 45 can set a predefined x-tilting angle (tilting in the xz plane) and, independently thereof, a y-tilting angle (tilting in the yz plane) of the individual mirror 44, such that an angle $AS_x$ of reflection of an illumination light partial beam 48 reflected by the associated individual mirror 44 in the xy plane and correspondingly an angle $AS_x$ of reflection (not illustrated in the drawing) in the xz plane can be predefined.

The angular distribution—generated by the MMA 43—of angles AS of reflection of the illumination light partial beams 48, upon passing through a Fourier lens element arrangement or a condenser 49 positioned at the distance of its focal length from the MMA 43, is converted into a two-dimensional illumination light intensity distribution, that is to say an illumination light intensity distribution which is location-dependent perpendicularly to the optical axis 41. The intensity distribution thus generated is therefore present in a first illumination plane 17 of the illumination system 24. Together with the Fourier lens element arrangement 49, the MMA 43 therefore constitutes a light distribution device for generating a two-dimensional illumination light intensity distribution.

Arranged in the region of the first illumination plane 50 is a first raster arrangement 51 of a raster module 52, which is also designated as a fly's eye condenser. Angles of incidence $ER_y$ in the yz plane (cf. FIG. 9) and $ER_x$ in the xz plane (not illustrated in the drawing) of the illumination light 3 on the raster module 52 are correlated with the angles of reflection $AS_y$ (cf. FIG. 9), $AS_x$ (not illustrated in the drawing) of the illumination light partial beams 48 from the MMA 43 and/or the location from which the respective illumination light partial beam 48 emerges from the MMA 43, that is to say the respective individual mirror 44. This correlation is predefined by the Fourier lens element arrangement 49. With the use of a Fourier lens element arrangement 49, that is to say not a condenser, the locations of impingement of the illumination light partial beams 48 on the first raster arrangement 51 are directly correlated with the angles of reflection $AS_S$, $AS_y$ of the illumination light partial beams 48 from the MMA 43 since the Fourier lens element arrangement 49 approximately results in a conversion of angles into spatial coordinates. Both when a Fourier lens element arrangement 49 is used and when a condenser 49 is used, the angles of incidence $ER_x$, $ER_y$ of the illumination light partial beams 48 on the raster module 52 are directly correlated with the positions of the illumination light partial beams 48 on the MMA 43, that is to say with the individual mirror 44 from which the respective illumination light partial beam 48 emerges, since both the use of a Fourier lens element arrangement 49 and the use of a condenser 49 result in a conversion of spatial coordinates into angles.

The raster module 52 serves for generating a spatially distributed arrangement of secondary light sources, that is to say of images of the primary light source 2, and thus for generating a defined illumination angle distribution of the illumination light emerging from the raster module 52.

A second raster arrangement 54 is arranged in a further illumination plane 53. The illumination plane 50 is in or in proximity to a front focal plane of individual elements of the second raster arrangement 54. The two raster arrangements 51, 54 constitute a fly's eye condenser of the illumination optical unit 25. The further illumination plane 53 is a pupil plane of the illumination system 24 or is adjacent to a pupil plane of the illumination system 24. The raster module 52 is therefore also designated a field defining element (FDE).

Angles of reflection $AR_y$ in the yz plane (cf. FIG. 9) and $AR_x$ in the xz plane (not illustrated in the drawing) at which the illumination light partial beams 48 leave the second raster arrangement 54 are uniquely assigned to a spatial region in the object field 18 on which the respective illumination light partial beam 48 impinges on the object field 18.

Disposed downstream of the raster module 52 is a further condenser 55, which is also designated as a field lens element. Together with the second raster arrangement 54 the condenser 55 images the first illumination plane 50 into a field intermediate plane 56 of the illumination system 24. A reticle masking system (REMA) 57 can be arranged in the field intermediate plane 56, the system serving as an adjustable shading diaphragm for generating a sharp edge of the illumination light intensity distribution. A downstream lens 58 images the field intermediate plane 56 onto the reticle, that is to say the lithography original, which is situated in the reticle plane 16. Via the projection lens 19, the reticle plane 16 is imaged onto the wafer or image plane 21 onto the wafer (not illustrated in FIG. 9), which is intermittently or continuously displaced in the scanning direction (y).

The raster construction and the function of the raster module 52 correspond, in principle, to what is described in WO 2007/093433 A1 and in WO 2009/135586 A1.

The field intermediate plane 56 coincides with an ejection channel plane of a correction device 59 for the two-dimensional influencing of the intensity of the illumination light beam 3. The function of the correction device 59 corresponds to that of the correction device 23 already explained above in connection with FIGS. 1 to 8. Components of the correction device 59 which correspond to those of the correction device 23 already explained above bear the same reference numerals and will not be discussed in detail again.

Only an entrance window 60 and an exit window 61 of the correction device 59 are illustrated in FIG. 9; further details of the correction device will become apparent with reference to FIG. 10.

Both the entrance window 60 and the exit window 61 are transmissive to the illumination or imaging light 3. Part of the correction device 59 is an evacuated chamber 62, through which runs the trajectory of the attenuating bodies 28 between the ejection device 26 and the collecting device 32. The entrance window 60 and the exit window 61 are inserted in a pressure-tight fashion into chamber walls of the evacuated chamber 62. The ejection device 26 and the collecting device 32 are contained in the evacuated chamber 62.

The discharge line 34 and a return of the attenuating body material from the collecting device 32 toward the ejection device 26 are not illustrated in FIG. 10. Such a return can be routed within the evacuated chamber 62 or leads through pressure-tight passages through the chamber walls.

The ejection channel plane 56 is perpendicular to the plane of the drawing in FIG. 10. In the ejection channel plane, the trajectories 38 of the ejection channels run parallel to one another. In FIG. 10, the trajectories 38 run vertically from top to bottom.

Via a control of the ejection instants for the attenuating bodies 28 of the different ejection channels, an intensity distribution of the illumination light beam 3 in the field intermediate plane 56 and thus a corresponding intensity distribution in the object plane 16 can once again be predefined two-dimensionally. In this case, the correction device 59 also has an effect on the intensity of the illumination of the illumination field 18 such that inner sections of the illumination field 18 can be influenced without the influencing of outer sections surrounding the inner sections.

The correction device 59, the illumination optical unit 25 and the object holder (not illustrated in FIG. 9) for mounting a reticle in the object plane 16 and an object holder drive corresponding to the components 17a, 17b of the embodiment according to FIG. 1 constitute a further embodiment of the illumination and displacement device in the embodiment according to FIG. 9.

The projection exposure apparatus 40 can also in turn comprise a measuring device corresponding to the measuring device 25a of the embodiment according to FIG. 1 for measuring a wavefront over the mirror field 20 in the image plane 21. The projection optical unit 19 and a wafer substrate holder (not illustrated in FIG. 9) with substrate holder drive and a synchronizing unit (likewise not illustrated in FIG. 9) for synchronizing the object holder drive with the substrate holder drive together with the illumination and displacement device constitute an optical system.

The correction device 59 can also be used in the projection exposure apparatus 1 according to FIGS. 1 to 8. Accordingly, the correction device 23 according to FIGS. 1 to 8 can also be used in the projection exposure apparatus 40 according to FIG. 9.

FIG. 11 shows a further embodiment of a correction device 63, which can be used instead of the correction devices 23 and 59, respectively.

The ejection channel plane 56 runs in the plane of the drawing in FIG. 11. The ejection channel plane 56 can once again coincide with the field intermediate plane of the illumination system 24 according to FIG. 9 or can be adjacent to the object plane 16, as in the embodiment according to FIGS. 1 to 8. A plurality of ejection channel planes 56 spaced apart from one another in the z-direction can also be present. A ray direction of the illumination light beam 3 runs perpendicularly to the plane of the drawing in FIG. 11.

The ejection device 26 of the correction device 63 is subdivided into a plurality of partial ejection units 64, which in each case eject the attenuating bodies 28 from an ejection channel 27 along a trajectory 38 within the ejection channel plane 56. FIG. 11 illustrates by way of example a plurality of the partial ejection units 64 and the ejection channels 27 thereof and the trajectories 38 of the attenuating bodies 28 ejected via the ejection channels 27. Via the different partial ejection units 64, the attenuating bodies 28 are therefore injected from different marginal points at a plurality of injection angles.

The partial ejection units 64 are arranged in a manner distributed around the illumination light beam 3. Only some of the partial ejection units 64 are illustrated in FIG. 11. In actual fact, so many of the partial ejection units 64 are arranged around the cross section of the illumination light beam 3 that the trajectories 38, partly with higher, partly with lower trajectory density, reach practically every location within the cross section of the illumination light beam 3 in the ejection channel plane 56.

Each of the partial ejection units 64 is assigned a corresponding partial collecting unit of the partial collecting device 32 for the attenuating bodies 28. The partial collecting units, in the same way as the discharge lines for the attenuating material and possibly return to the partial ejection units, are not illustrated in FIG. 11. Via the partly crossing trajectories 38 of the ejection channels 27 of the partial ejection units 64 of the correction device 63, the trajectories being injected at different angles, a two-dimensional intensity distribution of the illumination light beam 3 can be predefined via the respective local attenuation of the illumination light beam 3 by the attenuating bodies 28 in a defined manner, analogously to what has already been explained above in connection with the correction device 23 according to FIGS. 1 to 8.

FIG. 12 shows a further component of a correction device 65, which can be used with the further components of the correction devices 23, 59 or 63. The correction device 65 has as an additional component a correction element in proximity to the field in the form of an aspherized plane plate 66. The plane plate 66 is composed of material transparent to the illumination and imaging light 3. One of the two optical surfaces, a rear side 67 in the case of the arrangement according to FIG. 12, is embodied in plane fashion. The other of the two optical surfaces of the plane plate 68, the front side 68 in the case of the arrangement according to FIG. 12, is embodied in aspherized fashion with a refractive power that varies along the y-direction. This is illustrated schematically in the enlarged excerpt in FIG. 12. The plane plate 66 is part of the projection lens 19.

The aspherized plane plate 66 can be arranged in a plane 16' in proximity to the object plane 16. Such an arrangement is also designated as an arrangement in proximity to the field. The parameter P known from WO 2009/024164 A can be used for evaluating the field proximity. P<0.5 and in particular P<0.1 holds true for the aspherized plane plate.

The aspherized plane plate 66 has a great variation of the imaging aberration parameter A(y) along the scanning direction y. With the aid of aspherized plane plate 66, y-dependencies of the imaging aberration parameter can be impressed on the wavefront of the illumination light 3 in a spatially resolved manner, for which dependencies a good compensation is provided by predefinition of a corresponding intensity scanning profile I(y). Possibly unfavorable distributions A(y) of the imaging aberration parameter that are present on account of the optical design without the aspherized plane plate 66 can in this way be converted into dependencies that are more suitable for compensation by predefinition of a corresponding scanning profile intensity distribution I(y).

The aspherized plane plate 66 brings about a redistribution of the intensity of the illumination light 3 along the object displacement direction y at least in sections of the object field 18. The plane plate 66, too, can be designed with such an effect on the intensity of the illumination of the illumination or object field 18 in such a way that inner sections of the illumination field 18 can be influenced without the influencing of outer sections of the illumination field 18 surrounding the inner sections.

FIG. 13 shows a further embodiment of a correction device 69, which can be used instead of the correction devices 23, 59, 63 or 65.

The correction device 69 is embodied as an xy array composed of liquid crystal (LCD) elements 70, which, via an open-loop/closed-loop control device 71, the function of which corresponds to that of the control device 30, can be driven individually for the predefinition of a transmission of the respective liquid crystal elements 70 for the illumination and imaging light 3. The liquid crystal elements 70 are connected to an optical unit carrier, indicated schematically as a frame 70a in FIG. 13. The liquid crystal elements 70 can be switched between a transmissive and an absorbent state. Alternatively, it is also possible to predefine a transmission in a continuum between a maximum and a minimum transmission of the respective liquid crystal elements 70. The function of the correction device 69 corresponds to that of the correction device 23, wherein the attenuating bodies 28 are replaced by liquid crystal elements 70 switched to be correspondingly (partly) absorbent.

The correction device 69 is constructed as an ij array, wherein i and j can be in the range of between 2 and 1000 or even greater.

The setting of an absorption via the liquid crystal elements 70 can be effected using a linear polarization of the illumination light 3.

The correction device 69, too, can be embodied such that inner sections of the illumination field 18 can be influenced without the influencing of outer sections of the illumination field 18 surrounding the inner sections.

A further embodiment of a correction device 72, which can be used instead of the correction devices 23, 59, 63, 65 or 69, is described below with reference to FIG. 14. Components corresponding to those which have already been explained above with reference to FIGS. 1 to 13 and 15 to 20, in particular with reference to FIG. 9, bear the same reference numerals and will not be discussed in detail again.

The correction device 72 in the form of a mirror array, in particular an MMA 74, is arranged in a pupil plane 73 of the illumination optical unit 25. Analogously to the MMA 43, the MMA 74 comprises a plurality of individual mirrors 75 which can be tilted via respectively assigned actuators 76, controlled via a control device 77 in the manner of the controller 47. The individual mirrors 75 are in each case connected to a mirror carrier (not illustrated in more specific detail), that is to say to an optical unit carrier.

FIG. 14 illustrates a light path $48_0$ of an illumination light partial beam 48 in an initial position of one of the individual mirrors $75_1$ and a light path $48_K$ of the same partial beam 48 in the tilting position of the individual mirror $75_1$ as illustrated in FIG. 14. There is a resulting shift in the illumination intensity over the object field 18. The effect of this shift is illustrated in a dash-dotted fashion in FIG. 17. Instead of the initial intensity distribution $I_0(y)$, the result now is a shifted intensity distribution $I_{K2}(y)$ depicted in a dash-dotted fashion. Since no illumination light is lost as a result of attenuation or absorption, the effect of a tilting of the individual mirrors 75 and a corresponding redistribution of the illumination intensity over the object field 18 result in a further improved effect of the correction device 72. In the case of the example illustrated in FIG. 17, the ratio $I_{AE,K2}/I_{FE}$ is increased relative to the already discussed ratio produced by attenuation via the attenuating bodies 28 of the correction device 23 and the aberration correction is thus improved.

The correction device 72, too, can be embodied such that inner sections of the illumination field 18 can be influenced without the influencing of outer sections of the illumination field 18 surrounding the inner sections.

With the aid of the illumination set by the correction device 23, 59, 63 or 65, 69 or 72, structured components, in particular semiconductor components in the form of micro-chips, for example memory chips, can now be produced via the projection exposure apparatus 1 or 40, respectively. For this purpose, the wafer 22 is provided, on which a layer composed of a light-sensitive material is at least partly applied. Moreover, the reticle 17 comprising the structures to be imaged is provided. Via the projection exposure apparatus 1, at least one part of the reticle 17 is then projected onto a region of the layer of the wafer 22. The micro- or nanostructured component is then produced by developing the light-sensitive layer.

The correction devices 23, 59, 63, 65, 69 or 72 can have an effect over the entire object field 18 or alternatively over one or more sections of the object field 18. A corresponding effect arises over the image field 20.

Instead of the liquid crystal elements 70, which are individually switchable, it is possible to make available array arrangements composed of transmissive raster elements with given absorption absorbent raster elements in a changer, wherein a respectively desired distribution of transmissive and absorbent raster elements for predefining an intensity distribution I(y) can be generated by inserting the respective raster.

The correction devices 23, 59, 63, 69 or 72 can be designed, in the case of a pulsed manner of operation of the light source 2, such that a changeover of the respective correction device 23, 59, 63, 69 is effected for the predefinition of different illumination intensity distributions I(y) which are spatially resolved along the object displacement direction y over the illumination or object field 18 between individual light pulses of the light source 2 that are used for the illumination.

The possibilities of influencing the illumination intensity I depending on the image field coordinate y, that is to say depending on the coordinate along the object displacement direction, are elucidated again below with reference to FIGS. 22 to 25. This effect can be achieved with any of the correction devices described above, that is to say in particular with the correction devices 23, 59, 63, 65, 69 or 72 illustrated in the drawings.

This is illustrated below on the basis of the example of the effect of the correction device 23. FIG. 22 shows the ideal case of field illumination uninfluenced by the correction device 23.

An illumination intensity $I=I_0$ arises at all three field points $y_1=y_A$, $y_2$ and $y_3=y_E$. The three field points $y_1$, $y_2$ and $y_3$ are situated equidistantly with respect to one another.

FIG. 23 shows the effect of the correction device 23 in a first influencing situation, that is to say in the case of a first distribution of the droplets 28 along the y-coordinate or, for example in the case of a different variant of the correction devices described above, in the case of a different mirror tilting position. At the coordinate $y_1$, the illumination intensity $I_1(y_1)$ arises, that is to say an intensity which, at the first of the three object field points $y_1$, $y_2$, $y_3$ along the object displacement direction, deviates by a first influencing intensity factor k1 from the uninfluenced intensity $I_0$ of the first object field point $y_1$. For the influencing intensity factor k1 the following holds true: $k1=I_1(y_1)/I_0$. In this first influencing situation, an intensity $I_1(y_2)$ results from the effect of the correction device 23 at the second object field point $y_2$ along the object displacement direction. The intensity deviates by a second influencing intensity factor k2 from the uninfluenced intensity $I_0$ at the second object field point $(y_2)$. The following holds true: $k2=I_1(y_2)/I_0$. The following additionally holds true: $k1 \neq k2$.

FIG. 24 shows the intensity ratios in the case of a second influencing situation of the correction device 23, that is to say in the case of an influencing situation changed over in comparison with the first influencing situation. In this situation there is now a different distribution of the droplets 28 along the y-coordinate or, in the case of a different embodiment of the correction device, for example a different mirror tilting position.

The intensity influencing at the first object field point $y_1$ in the second influencing situation is of no further interest at this juncture. At the second object field point $y_2$ along the object displacement direction $y_2$, the illumination intensity $I_2(y_2)$ achieved in the second influencing situation deviates from the uninfluenced intensity $I_0$ once again exactly by the first influencing intensity factor k1. The following therefore holds true: $I_2(y_2) = k1 \times L$. Furthermore the following holds true: $I_1(y_1) = I_2(y_2)$.

In the second influencing situation of the correction device 23, the intensity $I_2(y_3)$ at the third object field point $y_3$ furthermore deviates by a third influencing intensity factor K3 from the uninfluenced intensity $I_0$. The following therefore holds true: $I_2(y_3) = k3 \times I_0$. On account of the free adjustability of the correction device 23, $k3 \neq k2$ holds true. The following therefore holds true: $I_1(y_2) = I_2(y_3)$. The illustration there shows in a solid fashion the intensity profile $I_1$ along the y-coordinate of the first illumination situation and in a dashed fashion the intensity profile $I_2$ along the y-coordinate in the second influencing situation of the correction device 23. The dashed $I_2$ curve does not attain the value $I_1(y_2)$ at the object field point $y_3$, rather the following holds true: $I_2(y_3) < I_1(y_2)$.

The superiority of the correction device 23 is manifested here with regard to the adjustable degrees of freedom of intensity influencing via the y-coordinate in comparison with, for example, a neutral filter that can be inserted along the y-coordinate. With such a neutral filter it would only be possible to achieve intensity influencing $I_2'$ in the second influencing situation which is continued in a dash-dotted fashion in the region of the third object field point $y_3$ in FIG. 25. The intensity influencing $I_2'$ necessarily attains the value $I_2'(y_3) = I_1(y_2)$ at the object field point $y_3$. For such a neutral filter that is not according to the invention, therefore, the inequality $I_1(y_2) \neq I_2(y_3)$ cannot hold true.

The invention claimed is:

1. A system, comprising:
    an illumination optical unit configured to illuminate an illumination field;
    an object holder configured to hold an object so that at least one part of the object is arrangeable in the illumination field;
    an object holder drive configured to displace the object in an object displacement direction; and
    a correction device configured to influence an intensity of the illumination of at least sections of the illumination field in a spatially resolved manner at least along the object displacement direction, the correction device comprising an ejection device comprising an ejection channel configured to eject non-gaseous bodies,
    wherein the correction device is configured to influence the illumination of inner sections of the illumination field without simultaneously influencing outer sections of the illumination field, the outer sections of the illumination field surrounding the inner sections of the illumination field.

2. The system of claim 1, wherein the correction device is configured to redistribute the illumination intensity along the object displacement direction at least in sections of the illumination field.

3. The system of claim 1, wherein the correction device comprises an optical component arranged in proximity to the illumination field so that contributions of the correction device to imaging aberrations to be corrected vary along the object displacement direction.

4. The system of claim 1, wherein the correction device comprises:
    a collecting device configured to collect the ejected bodies, wherein the ejection device and the collecting device are configured so that: a) ejected bodies have a trajectory between the ejection device and the collecting device; and b) the illumination light intersects the trajectory of the ejected bodies.

5. The system of claim 1, further comprising a control device connected to the ejection device so that the control device controls when the ejection device ejects bodies.

6. The system of claim 1, wherein the ejection device comprises a row of ejection channels.

7. The system of claim 1, wherein the collecting device and the ejection device are in fluid communication with each other.

8. The system of claim 1, comprising a chamber which comprises first and second windows, wherein the first and second windows are transmissive to the illumination light, the chamber is evacuatable, and the chamber is configured so that the trajectory of the bodies intersects the chamber.

9. The system of claim 1, wherein the correction device comprises a plurality of optical sections connected to an optical unit carrier, and the optical sections are configured so that an effect of a given optical section on partial beams of the illumination light for illuminating sections of the illumination field along the object displacement direction is influenced by driving the optical section.

10. The system of claim 9, wherein the plurality of the optical sections comprise mirrors of a mirror array.

11. The system of claim 9, wherein the correction device comprises:
    a collecting device configured to collect the ejected bodies, wherein the ejection device and the collecting device are configured so that: a) ejected bodies have a trajectory between the ejection device and the collecting device; and b) the illumination light intersects the trajectory of the ejected bodies.

12. The system of claim 1, wherein:
    the effect of the correction device on the intensity for illuminating the illumination field at three equidistant object field points is such that:
    a) in a first influencing situation brought about the correction device:
        the intensity at the first of the three object field points along the object displacement direction deviates from an uninfluenced intensity at the first object field point by a first influencing intensity factor; and
        the intensity at the second of the three object field points along the object displacement direction deviates from an uninfluenced intensity at the second object field point by a second influencing intensity factor; and
    b) in a second influencing situation brought about by the correction device:
        the intensity at the second of the three object field points along the object displacement direction deviates from an uninfluenced intensity at the second object field point by the first influencing intensity factor; and
        the intensity at the third of the three object field points along the object displacement direction deviates from an uninfluenced intensity at the third object field point by a third influencing intensity factor; and
    the third influencing intensity factor differs from the second influencing intensity factor.

13. An optical system, comprising:
a system according to claim 1;
a projection optical unit configured to image an object field into an image field, the object field coinciding with the illumination field or being contained in the illumination field;
a substrate holder configured to hold a substrate so that at least part of the substrate is arrangeable in the image field;
a substrate holder drive configured to displace the substrate in a direction parallel to the object displacement direction; and
a synchronizing unit configured to synchronize the object holder drive and the substrate holder drive.

14. The optical system of claim 13, wherein the projection optical unit has a spatial distribution of imaging aberrations that varies over the illumination field, and the correction device is configured to influence the intensity of the illumination of at least sections of the illumination field depending on the spatial distribution of the imaging aberrations of the projection optical unit.

15. The optical system of claim 13, further comprising:
a measuring device configured to measure a wavefront of imaging light over the image field in a spatially resolved manner at least along the object displacement direction; and
an open loop/closed loop control device,
wherein the measuring device is signal connected to the open loop/closed loop control device, and the open loop/closed loop control device is signal connected to the correction device.

16. An apparatus, comprising:
a system according to claim 1;
a light source configured to provide the illumination light;
a projection optical unit configured to image an object field into an image field, the object field coinciding with the illumination field or being contained in the illumination field;
a substrate holder configure to hold a substrate so that at least part of the substrate is arrangeable in the image field;
a substrate holder drive configured to displace the substrate in a direction parallel to the object displacement direction; and
a synchronizing unit configured to synchronize the object holder drive and the substrate holder drive.

17. The apparatus of claim 16, wherein:
the light source provides pulses of the illumination light; and
the correction device predefines different illumination intensity distributions, which are spatially resolved along the object displacement direction, over the illumination field between individual light pulses of the light source.

18. A method of using a projection exposure apparatus comprising a system and a projection optical unit, the method comprising:
using the system to illuminate at least a portion of a reticle comprising structures; and
using the projection optical unit to project at least a portion of the structures onto a light-sensitive material,
wherein the system comprises a system according to claim 1.

19. The method of claim 18, wherein a first field point is imaged with a smaller imaging aberration than a second field point, and the first field point is illuminated with a higher intensity than the second field point.

20. The method of claim 18, wherein field points whose illumination intensity is influenced by the correction device lie on a straight line running parallel to the object displacement direction.

21. The system of claim 1, wherein the bodies comprise liquid bodies.

22. The system of claim 1, wherein the bodies comprise droplets.

23. The system of claim 1, wherein the bodies comprise microdroplets.

24. The system of claim 1, wherein the bodies comprise solid bodies.

25. The system of claim 1, wherein the bodies comprise solid microparticles.

* * * * *

UNITED STATES PATENT AND TRADEMARK OFFICE
CERTIFICATE OF CORRECTION

PATENT NO. : 9,134,613 B2  
APPLICATION NO. : 14/272982  
DATED : September 15, 2015  
INVENTOR(S) : Sonja Schneider et al.

It is certified that error appears in the above-identified patent and that said Letters Patent is hereby corrected as shown below:

In the specification,

Col. 10, line 24, delete "recur-ring" and insert -- recurring --.

Col. 23, line 11, delete "$I_2 (y_2) = k1 \times L$." and insert -- $I_2 (y_2) = k1 \times I_0$. --.

In the claims,

Col. 24, line 9, Claim 5, delete "claim 1," and insert -- claim 4, --.

Col. 24, line 12, Claim 6, delete "claim 1," and insert -- claim 4, --.

Col. 24, line 14, Claim 7, delete "claim 1," and insert -- claim 4, --.

Col. 24, line 16, Claim 8, delete "claim 1," and insert -- claim 4, --.

Signed and Sealed this  
Twenty-eighth Day of June, 2016

Michelle K. Lee  
*Director of the United States Patent and Trademark Office*